United States Patent
Su et al.

(10) Patent No.: US 9,312,186 B1
(45) Date of Patent: Apr. 12, 2016

(54) METHOD OF FORMING HORIZONTAL GATE ALL AROUND STRUCTURE

(71) Applicant: Taiwan Semiconductor Manufacturing Company Limited, Hsinchu (TW)

(72) Inventors: Huan-Chieh Su, Changhua County (TW); Jui-Chien Huang, Hsinchu (TW); Chun-An Lin, Tainan (TW); Chien-Hsun Wang, Hsinchu (TW); Chun-Hsiung Lin, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/532,074

(22) Filed: Nov. 4, 2014

(51) Int. Cl.
  *H01L 21/336* (2006.01)
  *H01L 21/8234* (2006.01)
  *H01L 29/423* (2006.01)

(52) U.S. Cl.
  CPC ...... *H01L 21/823481* (2013.01); *H01L 21/823431* (2013.01); *H01L 21/823437* (2013.01); *H01L 29/42392* (2013.01)

(58) Field of Classification Search
  CPC .............................................. H01L 21/823431
  USPC .................................................. 438/283, 284
  See application file for complete search history.

(56) References Cited

U.S. PATENT DOCUMENTS

| 8,551,833 B2 * | 10/2013 | Chang | B82Y 10/00 257/E21.632 |
| 8,637,359 B2 * | 1/2014 | Chang | H01L 29/66545 257/347 |
| 8,987,794 B2 * | 3/2015 | Rachmady | H01L 29/42392 257/288 |

OTHER PUBLICATIONS

S. Bangsaruntip et al.; Density scaling with gate-all-around silicon nanowire MOSFETs for the 10 nm node and beyond; IBM Research Division, 2013 IEEE; p. 20.2.1-20.2.4; 2013.
Sung-Gi Hur et al.; A Practical Si Nanowire Technology with Nanowire-on-Insulator structure for beyond 10nm Logic Technologies, 2013 IEEE; p. 26.5.1-26.5.4; 2013.

* cited by examiner

*Primary Examiner* — Chandra Chaudhari
(74) *Attorney, Agent, or Firm* — Jones Day

(57) ABSTRACT

This disclosure provides a horizontal structure by using a double STI recess method. The double STI recess method includes: forming a plurality of fins on the substrate; forming shallow trench isolation between the fins; performing first etch-back on the shallow trench isolation; forming source and drain regions adjacent to channels of the fins; and performing second etch-back on the shallow trench isolations to expose a lower portion of the fins as a larger process window for forming gates of the fins. Accordingly, compared to conventional methods limited by fin height from the STI, the double STI recess method provides greater fin height, which is a larger process window for HGAA nanowire formation, to easily produce multi-stack HGAA nanowires with high current density. The number of layers used in the multi-stack HGAA nanowires is not limited and may vary based on different designs.

20 Claims, 26 Drawing Sheets

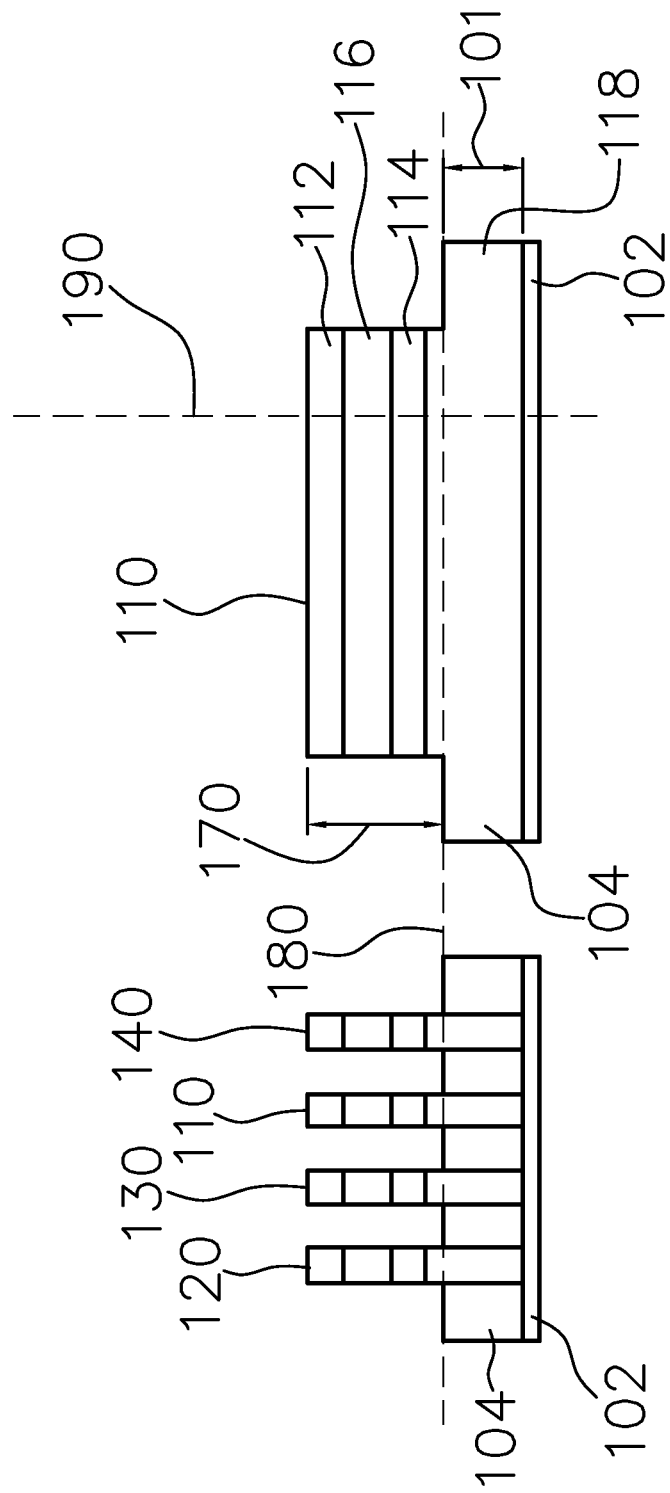

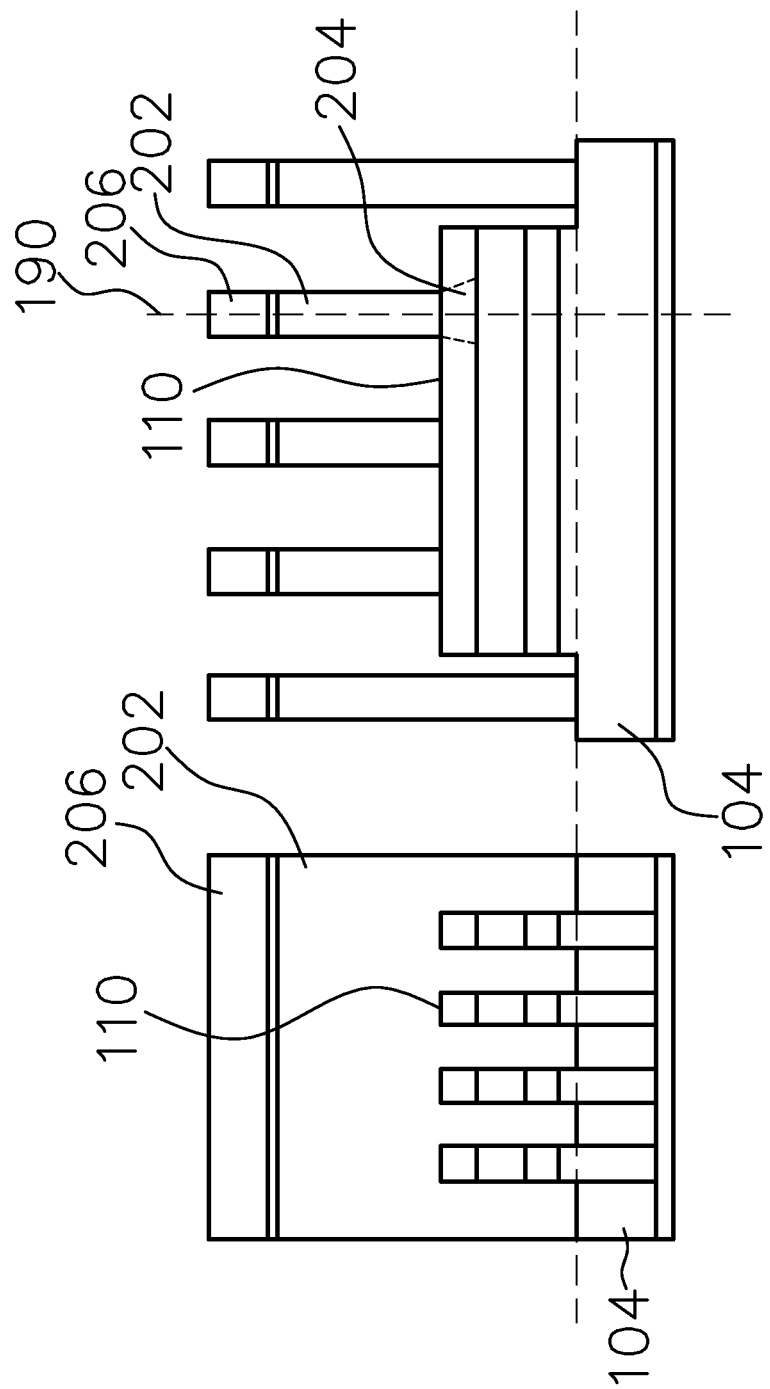

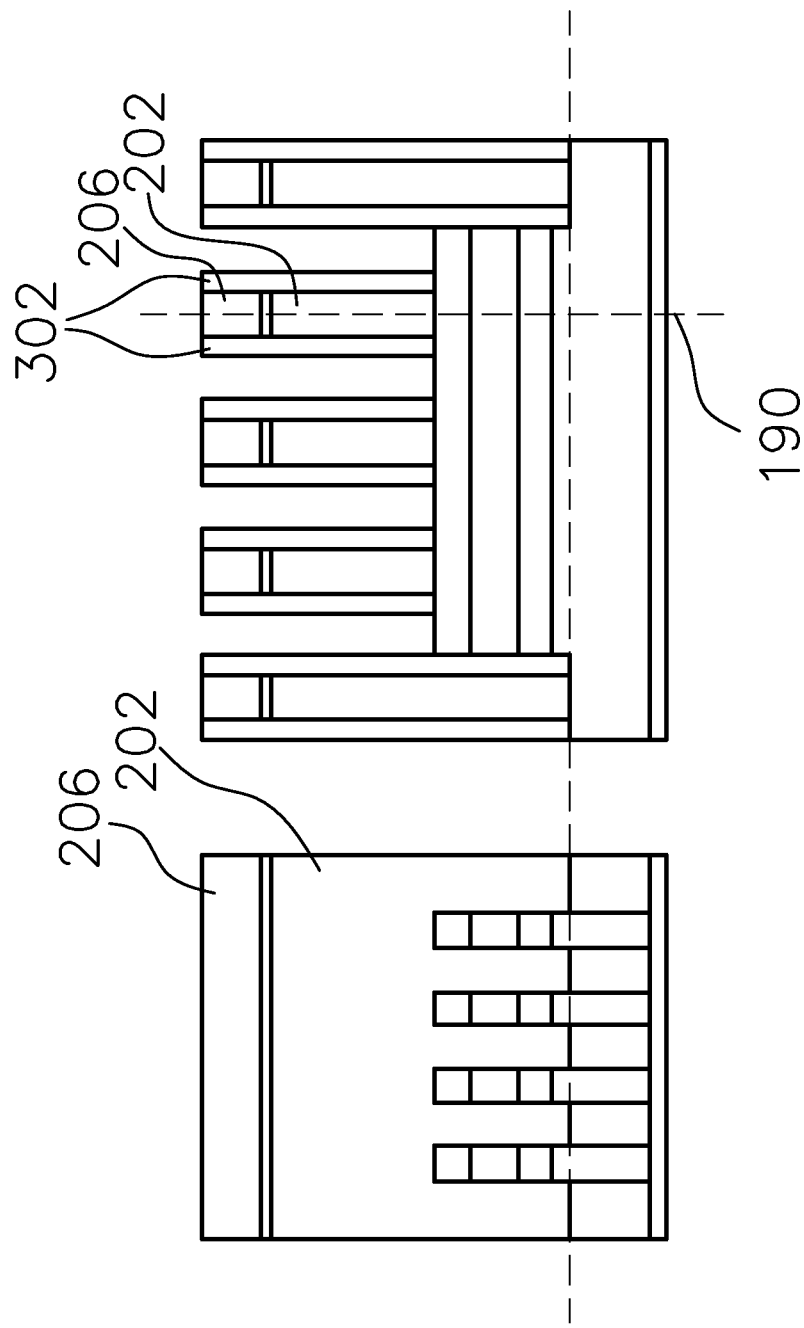

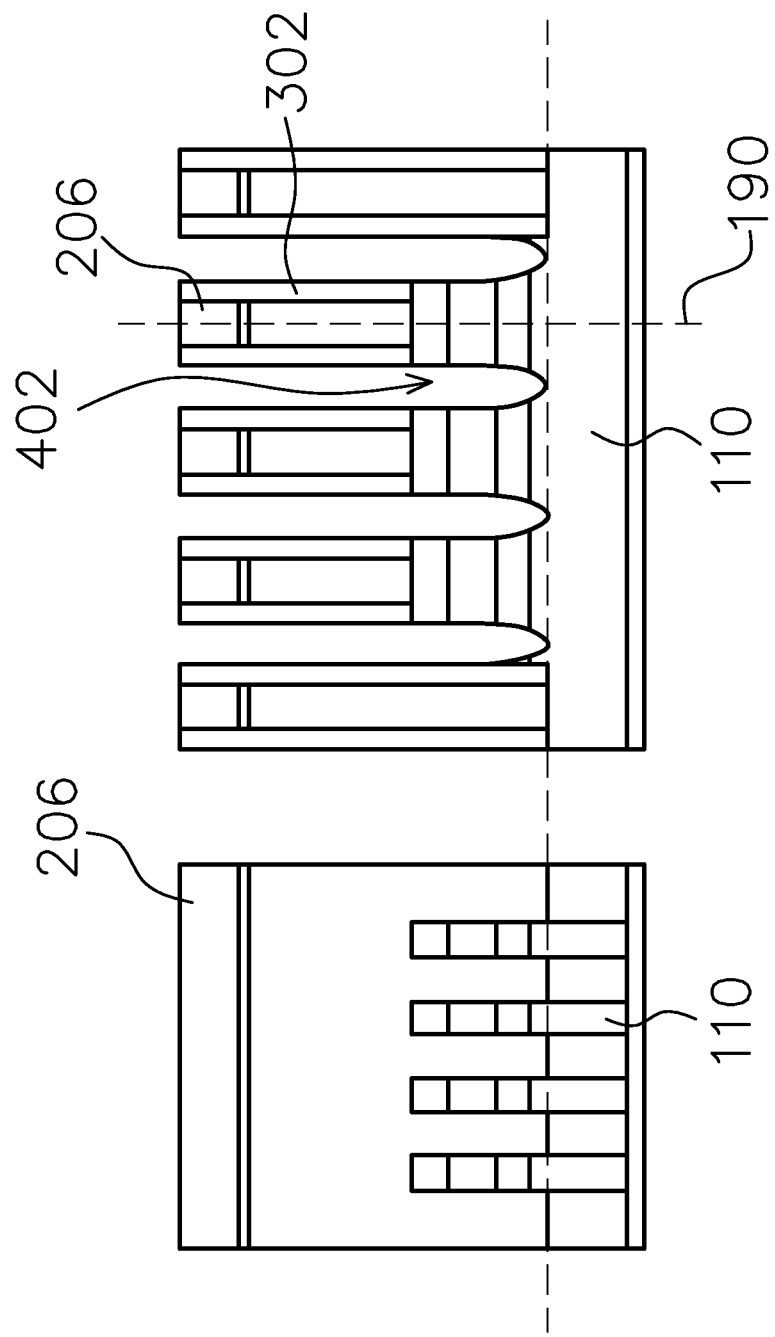

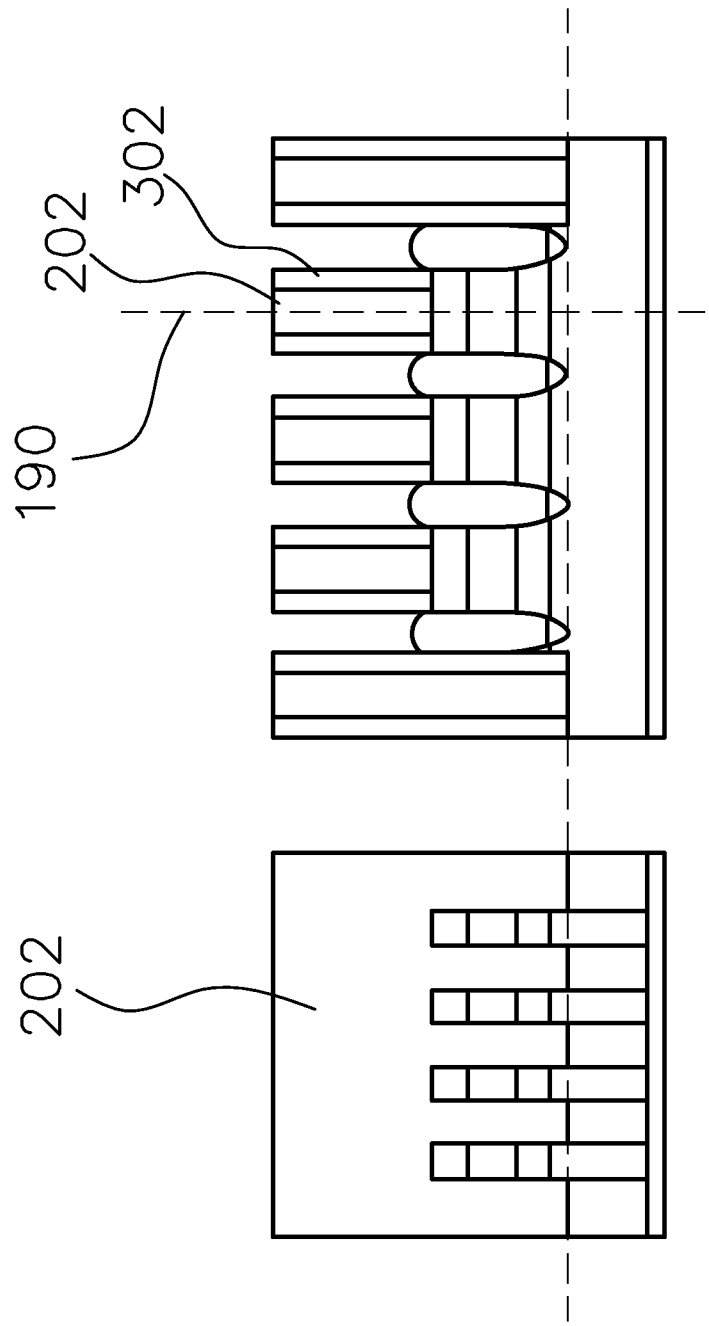

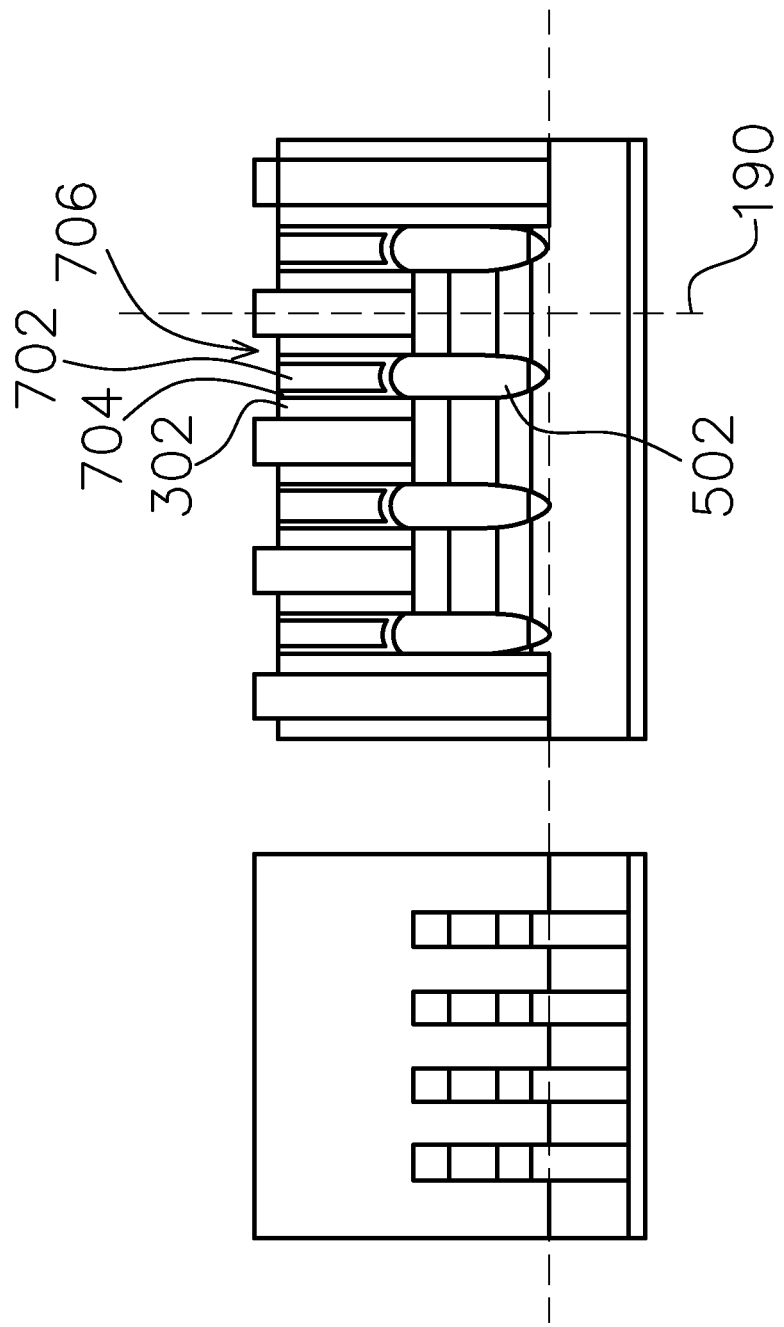

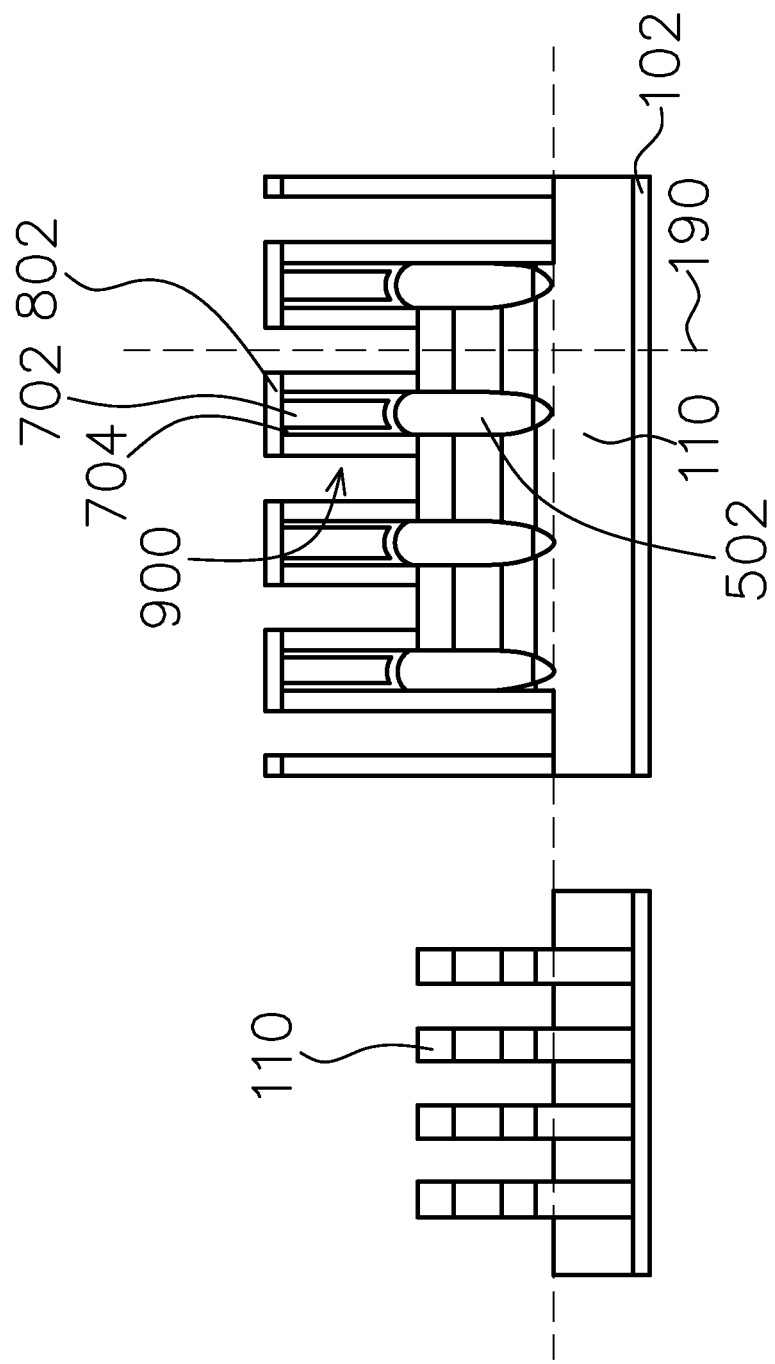

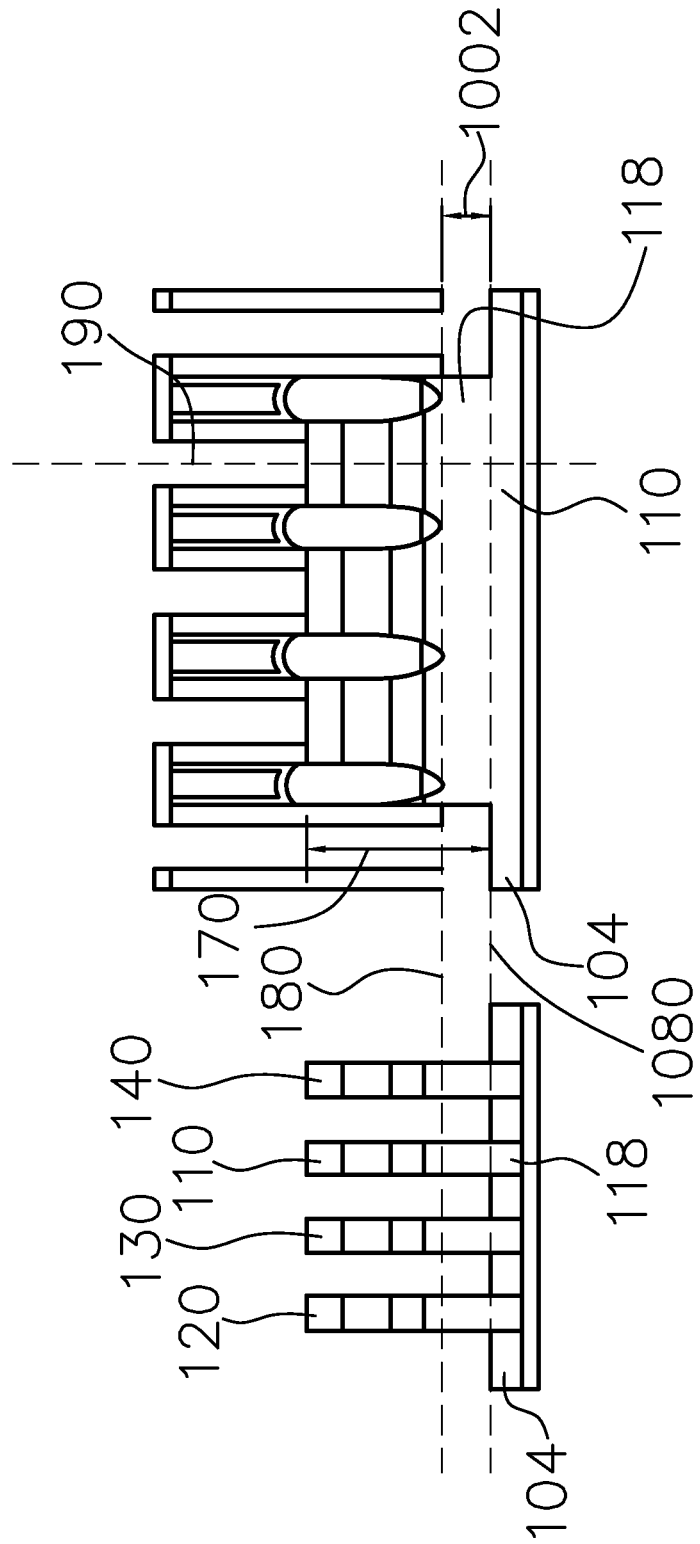

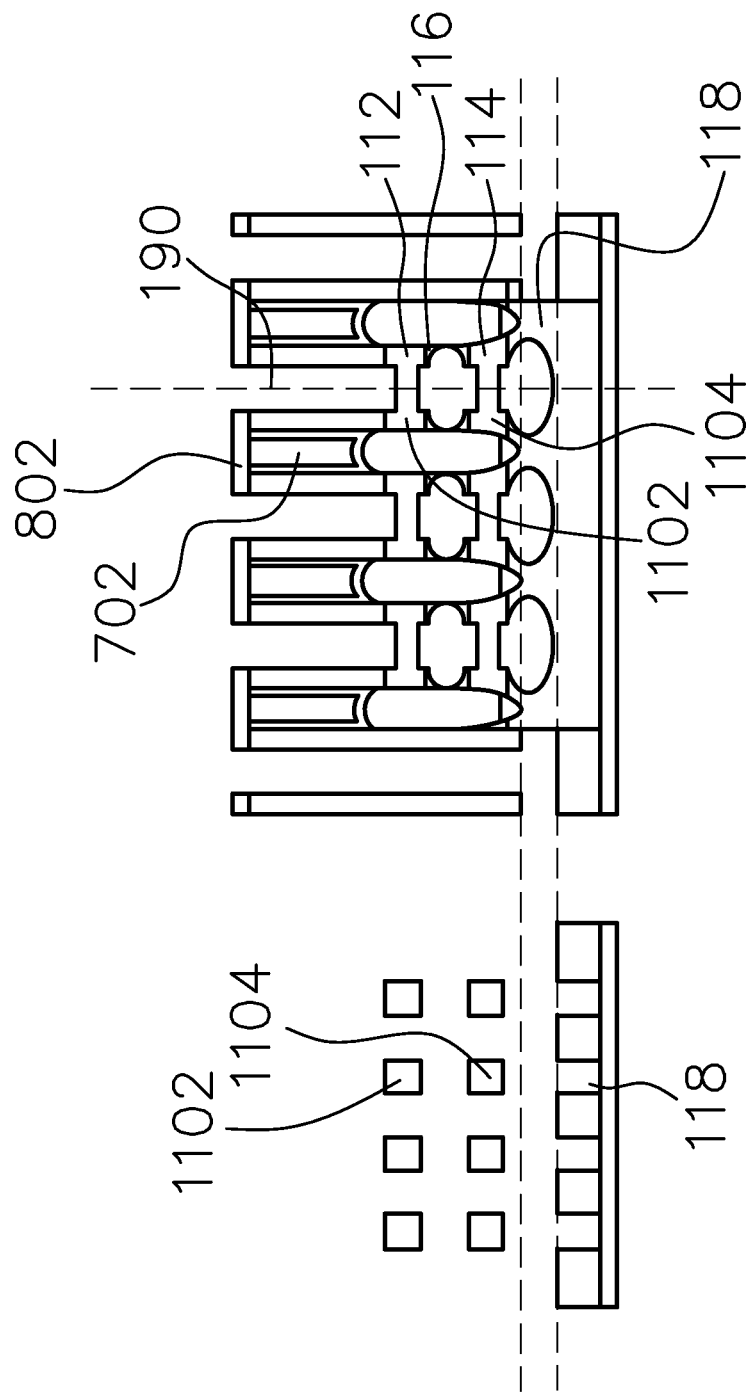

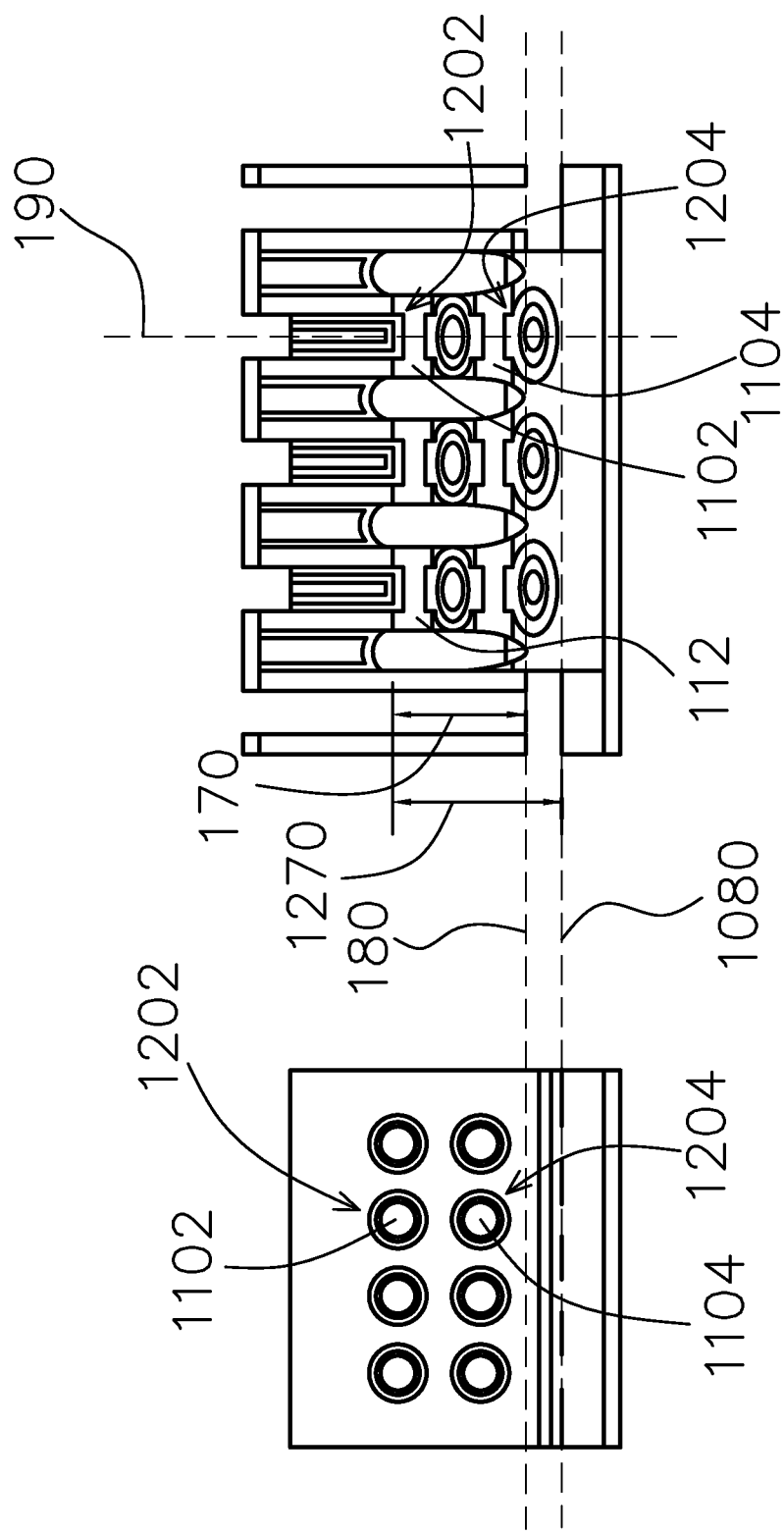

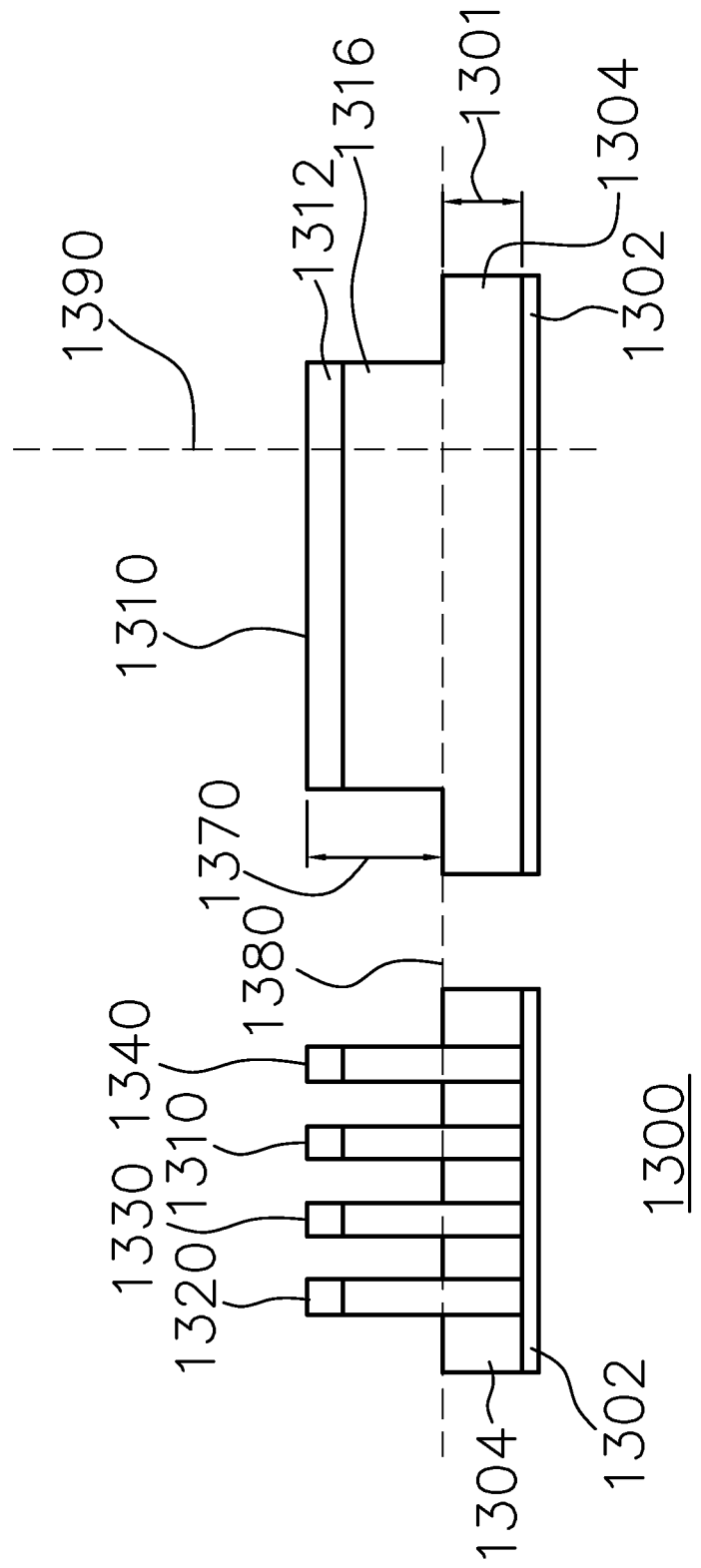

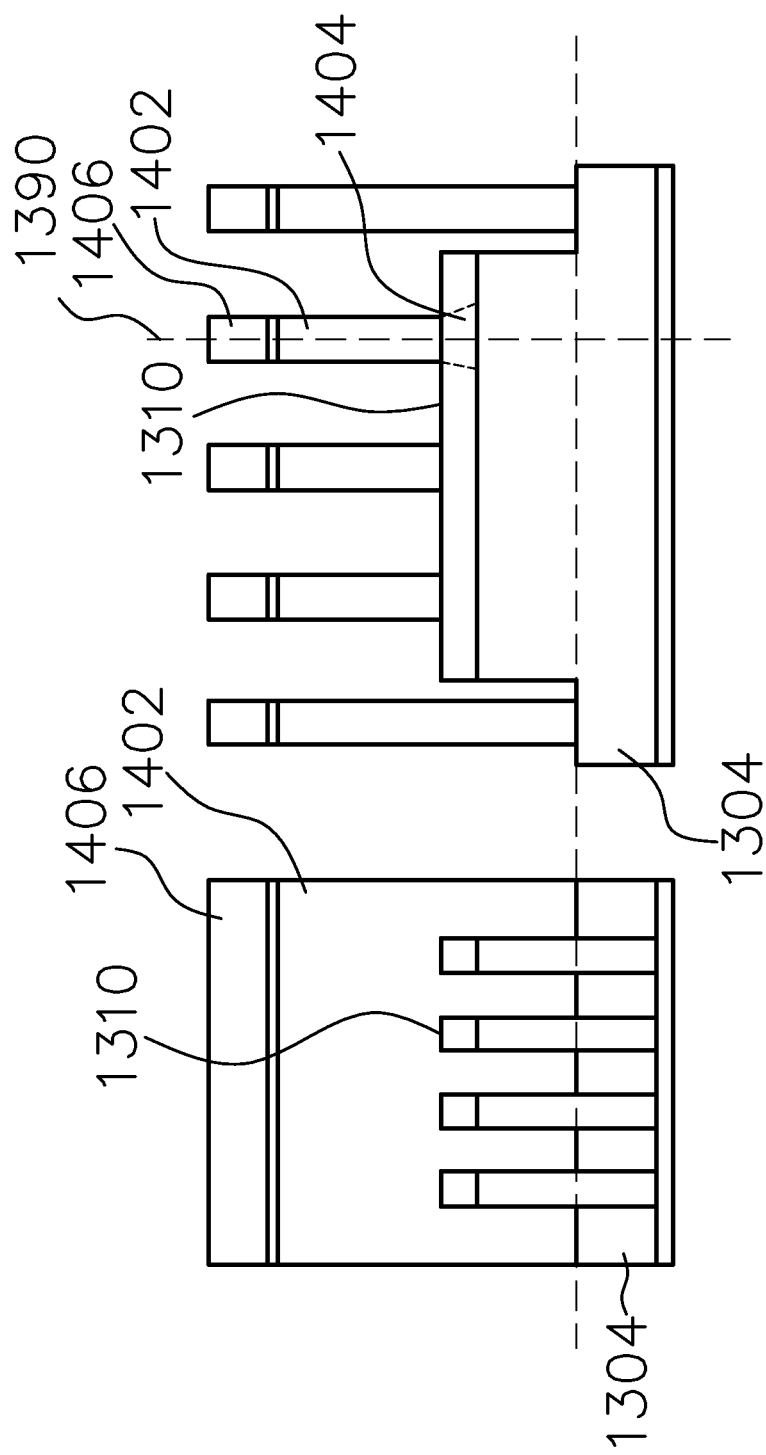

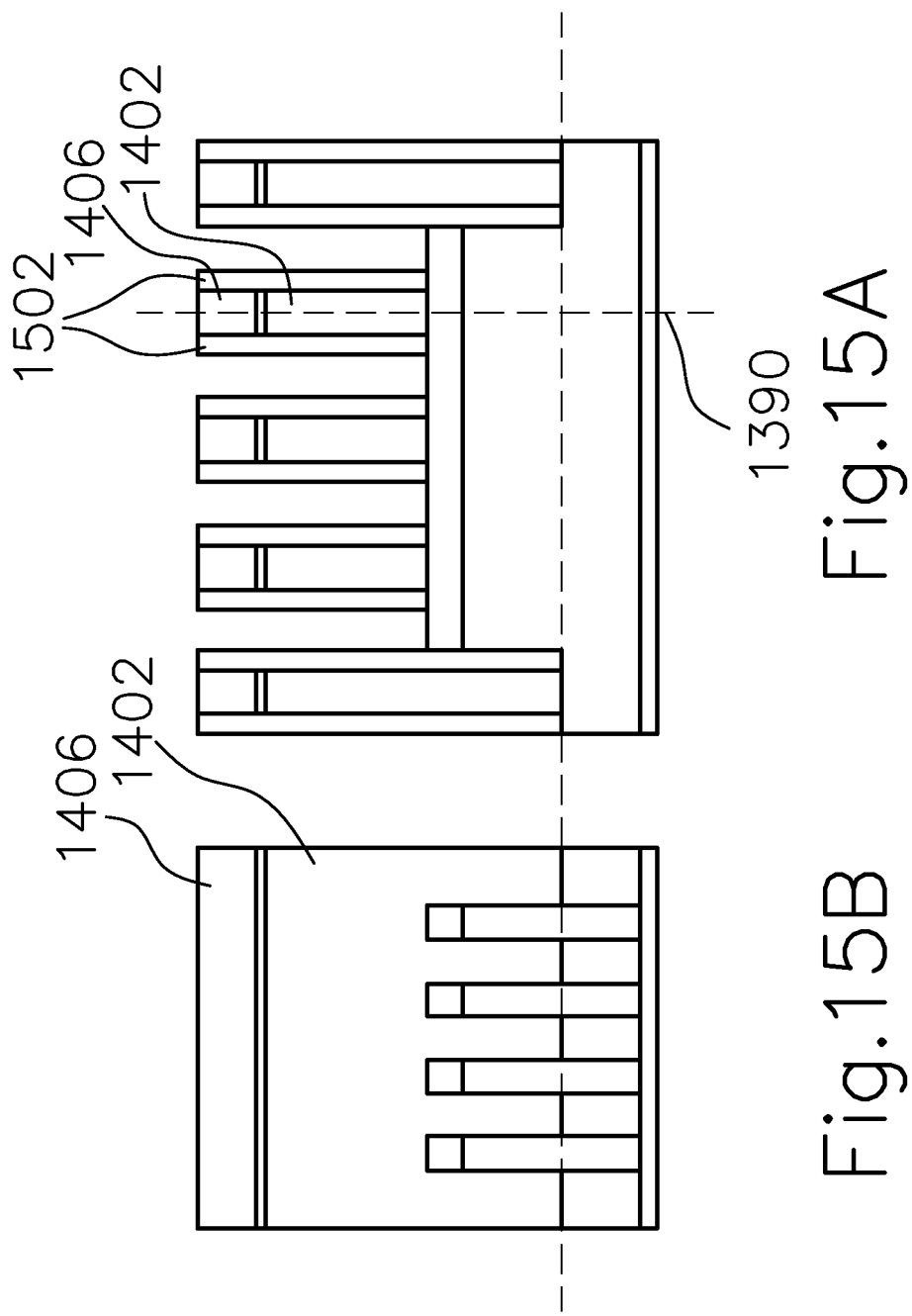

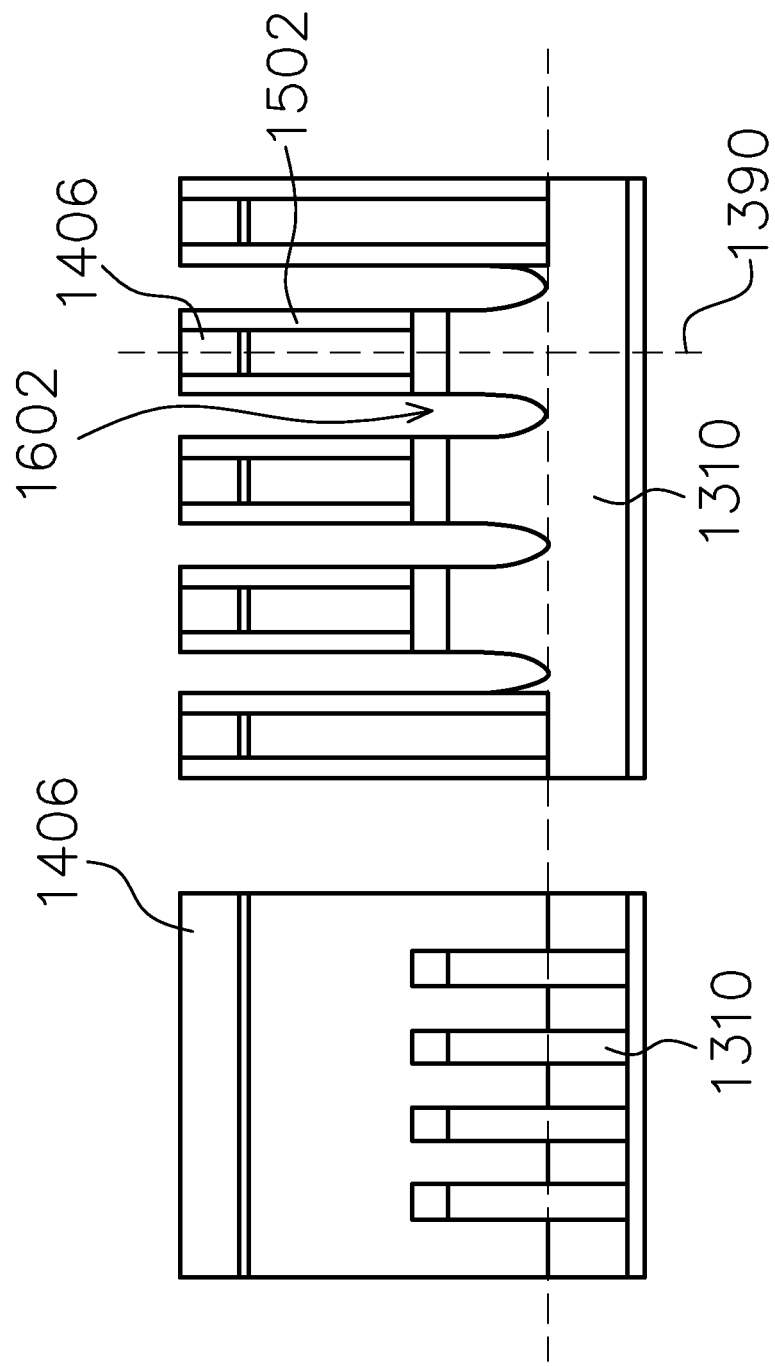

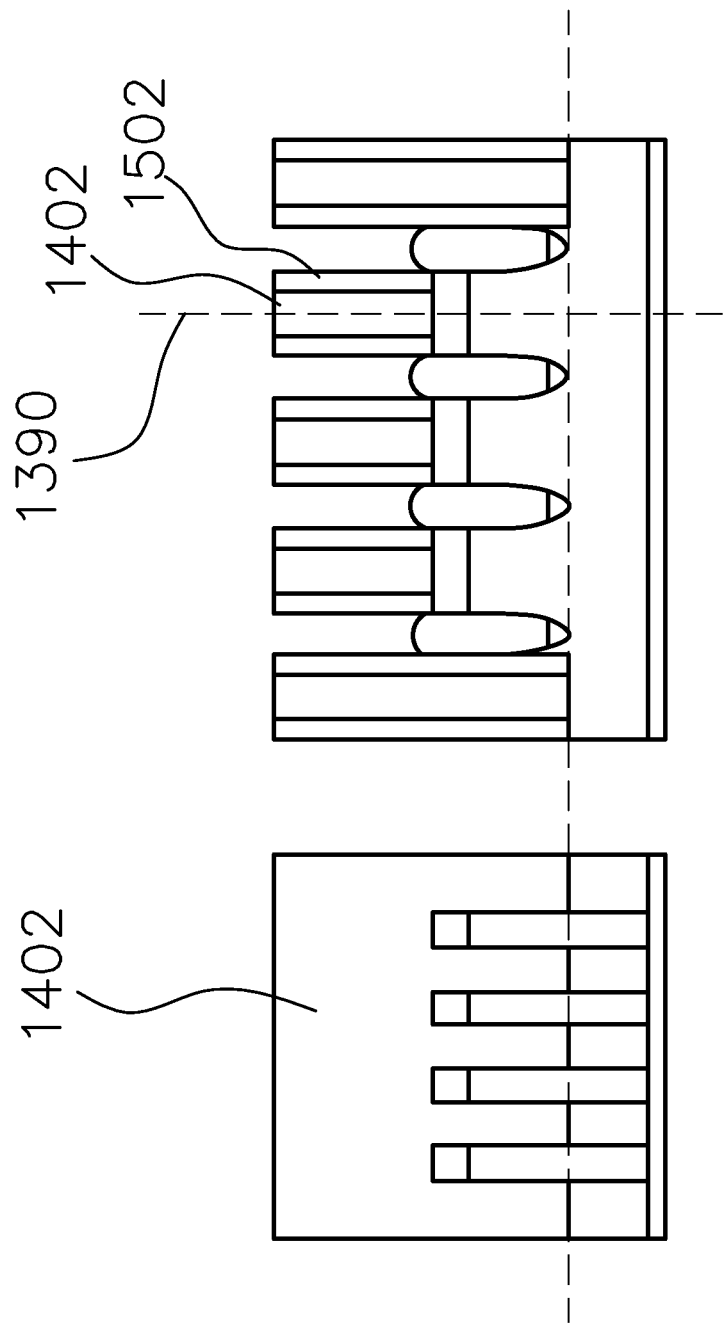

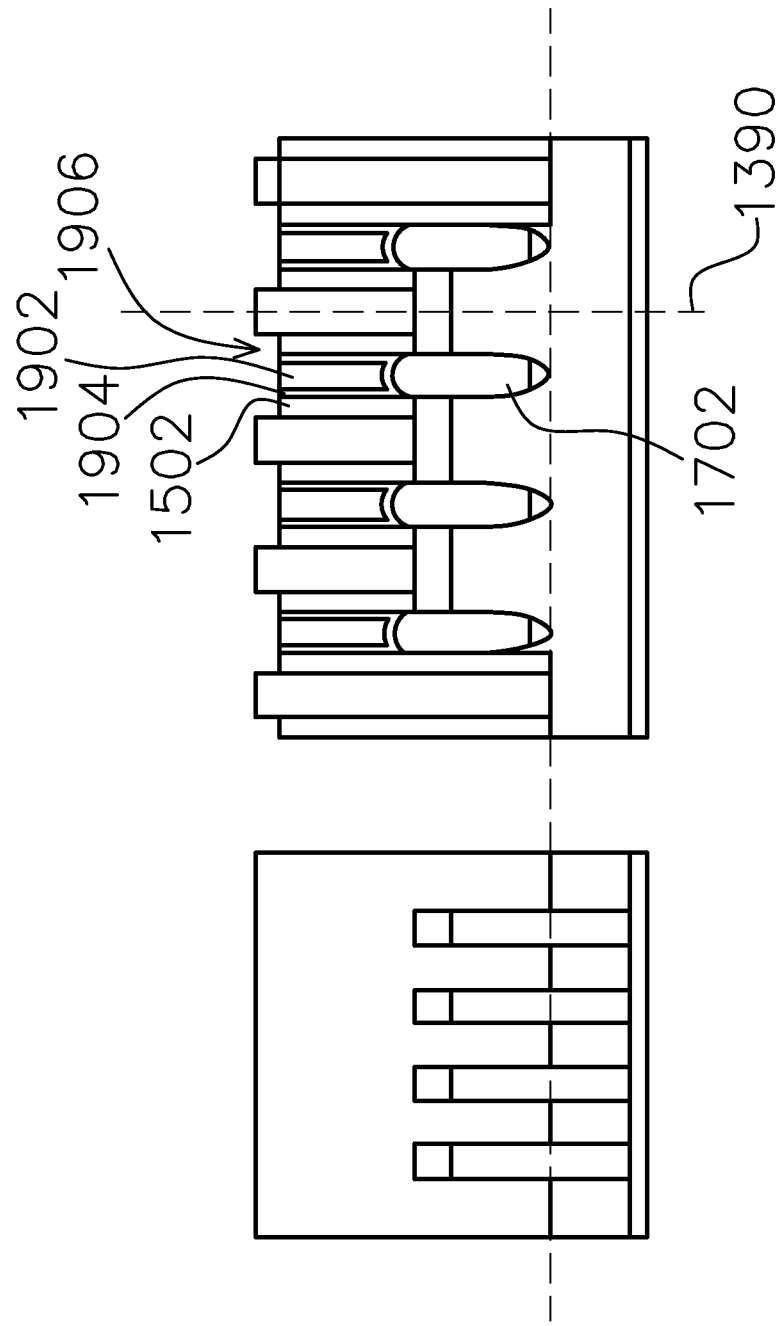

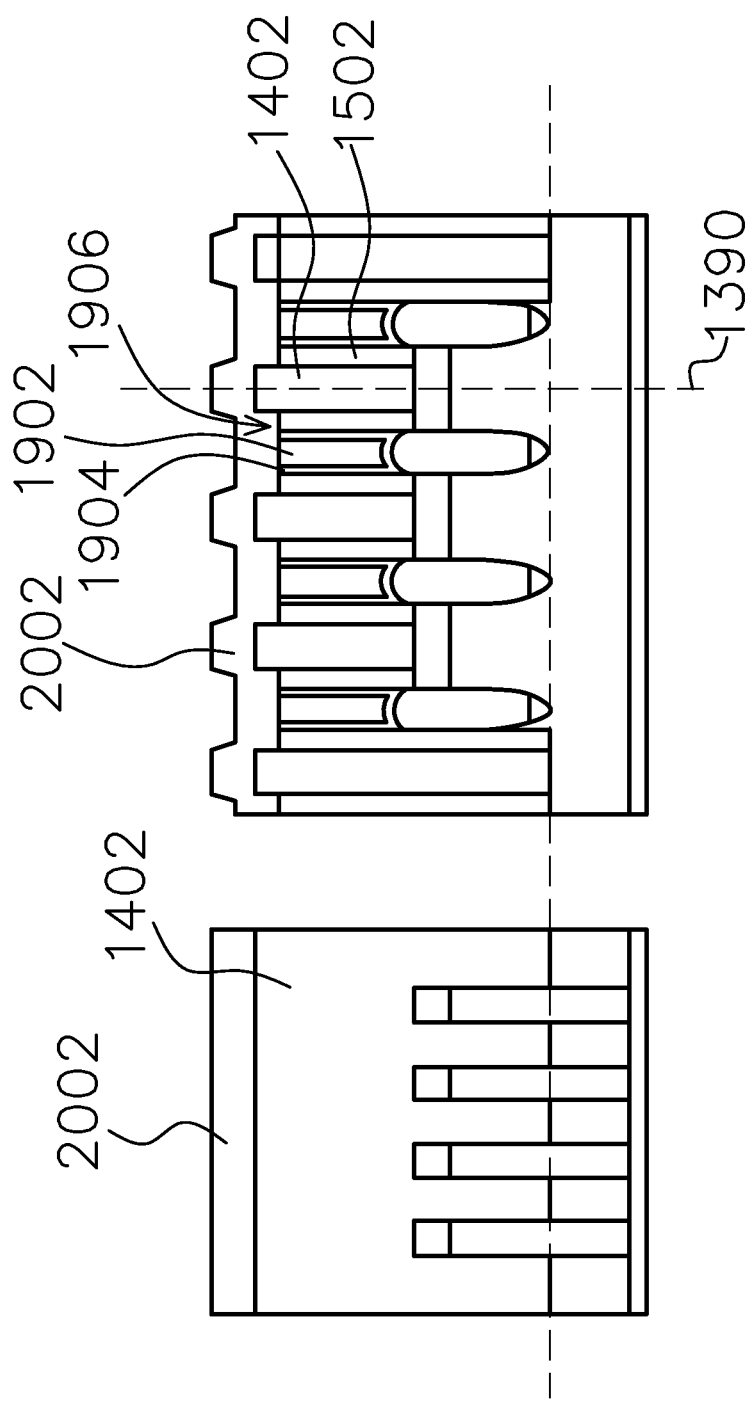

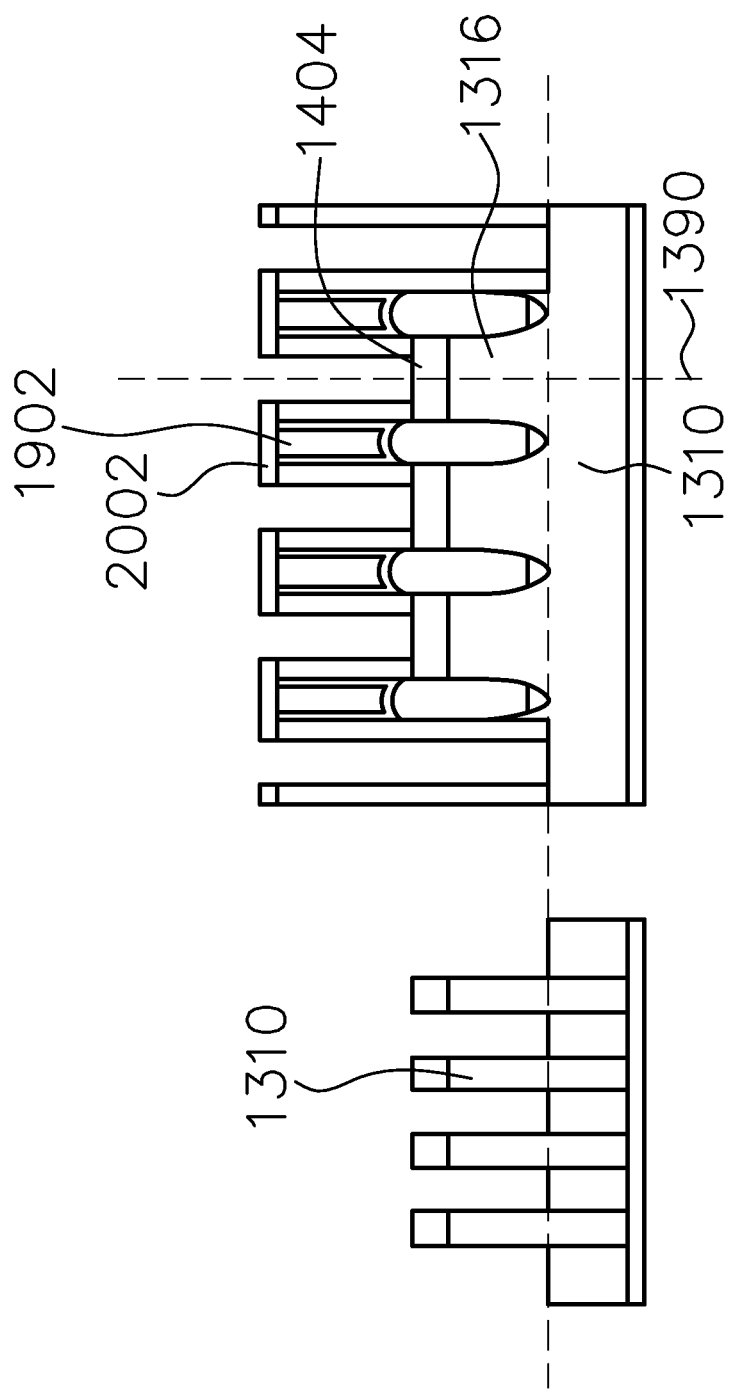

METHOD OF FORMING HORIZONTAL GATE ALL AROUND STRUCTURE

BACKGROUND

Semiconductor devices, such as horizontal gate-all-around (HGAA) transistors, are an emerging research area in the semiconductor industry. However, process integration for the device is a challenge because of high manufacturing complexity. Therefore, there is a need to improve the above deficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a longitudinal sectional view of an exemplary horizontal gate all around structure at one stage during fabrication in accordance with some embodiments.

FIG. 1B is a cross sectional view of the exemplary horizontal gate all around structure in FIG. 1A along the line 190 in accordance with some embodiments.

FIG. 2A is a longitudinal sectional view of the exemplary horizontal gate all around structure at another stage during fabrication in accordance with some embodiments.

FIG. 2B is a cross sectional view of the exemplary horizontal gate all around structure in FIG. 2A along the line 190 in accordance with some embodiments.

FIG. 3A is a longitudinal sectional view of the exemplary horizontal gate all around structure at another stage during fabrication in accordance with some embodiments.

FIG. 3B is a cross sectional view of the exemplary horizontal gate all around structure in FIG. 3A along the line 190 in accordance with some embodiments.

FIG. 4A is a longitudinal sectional view of the exemplary horizontal gate all around structure at another stage during fabrication in accordance with some embodiments.

FIG. 4B is a cross sectional view of the exemplary horizontal gate all around structure in FIG. 4A along the line 190 in accordance with some embodiments.

FIG. 6A is a longitudinal sectional view of the exemplary horizontal gate all around structure at another stage during fabrication in accordance with some embodiments.

FIG. 6B is a cross sectional view of the exemplary horizontal gate all around structure in FIG. 6A along the line 190 in accordance with some embodiments.

FIG. 7A is a longitudinal sectional view of the exemplary horizontal gate all around structure at another stage during fabrication in accordance with some embodiments.

FIG. 7B is a cross sectional view of the exemplary horizontal gate all around structure in FIG. 7A along the line 190 in accordance with some embodiments.

FIG. 9A is a longitudinal sectional view of the exemplary horizontal gate all around structure at another stage during fabrication in accordance with some embodiments.

FIG. 9B is a cross sectional view of the exemplary horizontal gate all around structure in FIG. 9A along the line 190 in accordance with some embodiments.

FIG. 10A is a longitudinal sectional view of the exemplary horizontal gate all around structure at another stage during fabrication in accordance with some embodiments.

FIG. 10B is a cross sectional view of the exemplary horizontal gate all around structure in FIG. 10A along the line 190 in accordance with some embodiments.

FIG. 11A is a longitudinal sectional view of the exemplary horizontal gate all around structure at another stage during fabrication in accordance with some embodiments.

FIG. 11B is a cross sectional view of the exemplary horizontal gate all around structure in FIG. 11A along the line 190 in accordance with some embodiments.

FIG. 12A is a longitudinal sectional view of the exemplary horizontal gate all around structure at another stage during fabrication in accordance with some embodiments.

FIG. 12B is a cross sectional view of the exemplary horizontal gate all around structure in FIG. 12A along the line 190 in accordance with some embodiments.

FIG. 13A is a longitudinal sectional view of an exemplary horizontal gate all around structure at one stage during fabrication in accordance with some embodiments.

FIG. 13B is a cross sectional view of the exemplary horizontal gate all around structure in FIG. 13A along the line 1390 in accordance with some embodiments.

FIG. 14A is a longitudinal sectional view of an exemplary horizontal gate all around structure at one stage during fabrication in accordance with some embodiments.

FIG. 14B is a cross sectional view of the exemplary horizontal gate all around structure in FIG. 14A along the line 1390 in accordance with some embodiments.

FIG. 15A is a longitudinal sectional view of an exemplary horizontal gate all around structure at one stage during fabrication in accordance with some embodiments.

FIG. 15B is a cross sectional view of the exemplary horizontal gate all around structure in FIG. 15A along the line 1390 in accordance with some embodiments.

FIG. 16A is a longitudinal sectional view of an exemplary horizontal gate all around structure at one stage during fabrication in accordance with some embodiments.

FIG. 16B is a cross sectional view of the exemplary horizontal gate all around structure in FIG. 16A along the line 1390 in accordance with some embodiments.

FIG. 18A is a longitudinal sectional view of an exemplary horizontal gate all around structure at one stage during fabrication in accordance with some embodiments.

FIG. 18B is a cross sectional view of the exemplary horizontal gate all around structure in FIG. 18A along the line 1390 in accordance with some embodiments.

FIG. 19A is a longitudinal sectional view of an exemplary horizontal gate all around structure at one stage during fabrication in accordance with some embodiments.

FIG. 19B is a cross sectional view of the exemplary horizontal gate all around structure in FIG. 19A along the line 1390 in accordance with some embodiments.

FIG. 20A is a longitudinal sectional view of an exemplary horizontal gate all around structure at one stage during fabrication in accordance with some embodiments.

FIG. 20B is a cross sectional view of the exemplary horizontal gate all around structure in FIG. 20A along the line 1390 in accordance with some embodiments.

FIG. 21A is a longitudinal sectional view of an exemplary horizontal gate all around structure at one stage during fabrication in accordance with some embodiments.

FIG. 21B is a cross sectional view of the exemplary horizontal gate all around structure in FIG. 21A along the line 1390 in accordance with some embodiments.

DETAILED DESCRIPTION

Figures 5A, 5B:
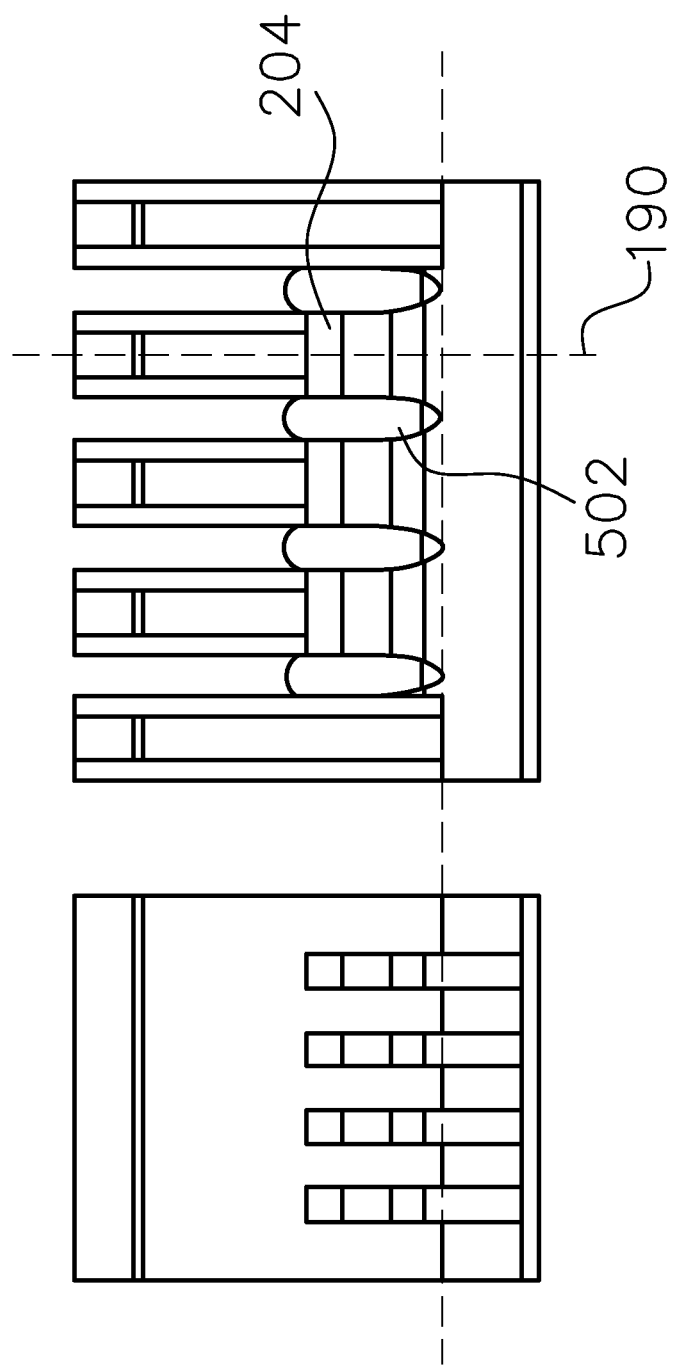
FIG. 5A is a longitudinal sectional view of the exemplary horizontal gate all around structure at another stage during fabrication in accordance with some embodiments.
FIG. 5B is a cross sectional view of the exemplary horizontal gate all around structure in FIG. 2A along the line 190 in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure provides a horizontal structure having a cap layer, which can be applied to horizontal gate-all-around (HGAA) devices. The method of forming horizontal structures having a cap layer includes: providing an interlayer dielectric layer and a poly layer adjacent to and having a top surface higher than the interlayer dielectric layer; forming a nitride layer as a cap layer over the poly layer and the interlayer dielectric layer; and performing CMP (chemical mechanical polishing) on the nitride layer and stopping at the poly layer. The cap layer may include one single layer or multiple sublayers, and the material of the cap layer may include at least one of SiN, SiCN, and SiCON. The cap layer protects the interlayer dielectric layer from damage by following processes.

This disclosure provides a horizontal structure by using a double STI recess method. The double STI recess method includes: forming a plurality of fins on the substrate; forming shallow trench isolation between the fins; performing first etch-back on the shallow trench isolation; forming source and drain regions adjacent to channels of the fins; and performing second etch-back on the shallow trench isolations to expose a lower portion of the fins as a larger process window for forming gates of the fins. Accordingly, compared to conventional methods limited by fin height from the STI, the double STI recess method provides greater fin height, which is a larger process window for HGAA nanowire formation, to easily produce multi-stack (e.g., at least two stacks) HGAA nanowires with high current density. The number of layers used in the multi-stack HGAA nanowires is not limited and may vary based on different designs.

FIG. 1A is a longitudinal sectional view of an exemplary horizontal gate all around structure at one stage during fabrication in accordance with some embodiments. FIG. 1B is a cross sectional view of the exemplary horizontal gate all around structure in FIG. 1A along the line 190 in accordance with some embodiments. As shown in FIGS. 1A and 1B, the semiconductor device 100 includes a plurality of fins 110, 120, 130, 140, a substrate 102, and a shallow trench isolation (STI) 104.

Each of the fins 110, 120, 130, and 140 includes a top channel layer 112, a bottom channel layer 114 below the top channel layer 112, a top sacrificial layer 116 between the top channel layer 112 and the bottom channel layer 114, and a bottom sacrificial layer 118 between the substrate 102 and the bottom channel layer 114. The material of the top channel layer 112 and the bottom channel layer 114 may be Si, and the material of the top sacrificial layer 116 and the bottom sacrificial layer 118 may be SiGe. The number of the fins 110, 120, 130, and 140 is not limited, and the number of the layers 112, 114, 116, and 118 used in the fins 110, 120, 130, and 140 is not limited and may vary based on different designs.

First, the STI 104 is filled between the fins 110, 120, 130, 140. Then, a first STI etch-back is performed on the STI 104 to expose the fins 110, 120, 130, 140 and stops at a first level 180 of the STI 104. The first STI etch-back may expose the top sacrificial layer 116 of the fins 110, 120, 130, 140.

In the embodiment, the exposed fin height 170 between the upper surface of the top channel layer 112 and the first level 180 of the STI 104 is less than about 50-70 nanometers. The thickness 101 of the STI 104 is about 50-200 nanometers.

FIG. 2A is a longitudinal sectional view of the exemplary horizontal gate all around structure at another stage during fabrication in accordance with some embodiments. FIG. 2B is a cross sectional view of the exemplary horizontal gate all around structure in FIG. 2A along the line 190 in accordance with some embodiments. As shown in FIGS. 2A and 2B, after formation of the fins, a poly layer 202 is formed over a preset portion 204 of the fin 110 corresponding to a channel to be produced in latter phases. A hard mask 206 is formed over the poly layer 202 for protecting its top.

FIG. 3A is a longitudinal sectional view of the exemplary horizontal gate all around structure at another stage during fabrication in accordance with some embodiments. FIG. 3B is a cross sectional view of the exemplary horizontal gate all around structure in FIG. 3A along the line 190 in accordance with some embodiments. As shown in FIGS. 3A and 3B, after forming the poly layer 202 and the hard mask 206, spacers 302 are formed over sidewalls of the poly layer 202 and the hard mask 206 to protect them from damage by the following processes.

FIG. 4A is a longitudinal sectional view of the exemplary horizontal gate all around structure at another stage during fabrication in accordance with some embodiments. FIG. 4B is a cross sectional view of the exemplary horizontal gate all around structure in FIG. 4A along the line 190 in accordance with some embodiments. As shown in FIGS. 4A and 4B, the fin 110, except for the portion covered by the hard mask 206 or by the spacers 302, is etched to create a recess 402 for source and drain regions.

FIG. 5A is a longitudinal sectional view of the exemplary horizontal gate all around structure at another stage during fabrication in accordance with some embodiments. FIG. 5B is a cross sectional view of the exemplary horizontal gate all around structure in FIG. 5A along the line 190 in accordance with some embodiments. As shown in FIGS. 5A and 5B, by using epitaxial growth operations, a source and drain region 502 is formed adjacent to the preset portion 204 corresponding to the channel. The source and drain material may include, for example, SiP for N-type devices and, for example, SiGeB for P-type devices.

FIG. 6A is a longitudinal sectional view of the exemplary horizontal gate all around structure at another stage during fabrication in accordance with some embodiments. FIG. 6B is a cross sectional view of the exemplary horizontal gate all around structure in FIG. 6A along the line 190 in accordance with some embodiments. As shown in FIGS. 5A, 5B, 6A and 6B, after source and drain region formation, the hard mask 206 and the portion of the spacers 302 surrounding the hard mask 206 are removed.

FIG. 7A is a longitudinal sectional view of the exemplary horizontal gate all around structure at another stage during fabrication in accordance with some embodiments. FIG. 7B is a cross sectional view of the exemplary horizontal gate all around structure in FIG. 7A along the line 190 in accordance with some embodiments. As shown in FIGS. 7A and 7B, after removal of the hard mask 206, formation of the interlayer dielectric layer 702 over the source and drain region 502 may take place. The formation of the interlayer dielectric layer 702 may involve depositing interlayer dielectric material and shaping the interlayer dielectric material using CMP processes. Additionally, an etch stop layer 704 may be deposited before the interlayer dielectric layer formation. Next, the spacers 302, the etch stop layer 704, and the interlayer dielectric layer 702 are etched back to make a recess 706.

Figures 8A, 8B:
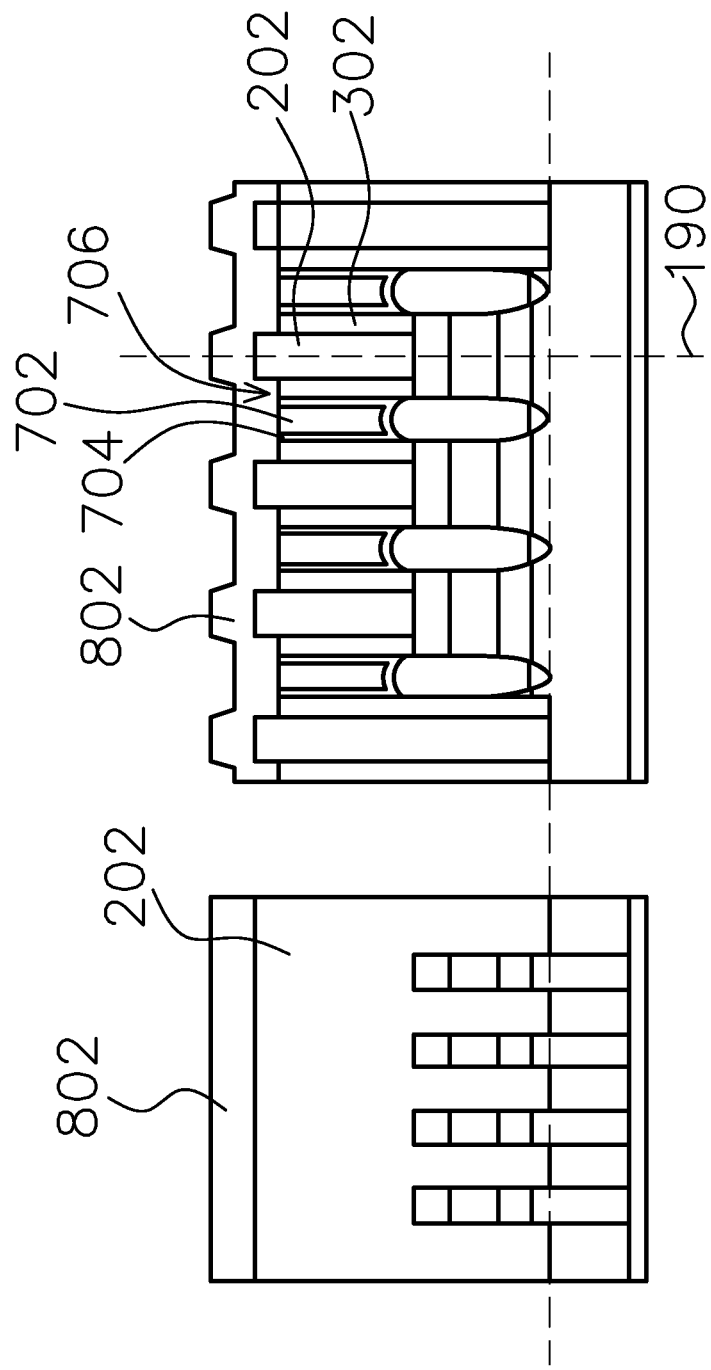
FIG. 8A is a longitudinal sectional view of the exemplary horizontal gate all around structure at another stage during fabrication in accordance with some embodiments.
FIG. 8B is a cross sectional view of the exemplary horizontal gate all around structure in FIG. 8A along the line 190 in accordance with some embodiments.

FIG. 8A is a longitudinal sectional view of the exemplary horizontal gate all around structure at another stage during fabrication in accordance with some embodiments. FIG. 8B is a cross sectional view of the exemplary horizontal gate all around structure in FIG. 8A along the line 190 in accordance with some embodiments. As shown in FIGS. 8A and 8B, a cap layer 802 is deposited over the poly layer 202, the spacers 302, the etch stop layer 704, and the interlayer dielectric layer 702. The material of the cap layer 802 may includes SiN and SiCN. The cap layer 802 may have a thickness of about 20-60 nanometers (SiN for about 10-30 nanometers and SiCN for about 10-30 nanometers).

FIG. 9A is a longitudinal sectional view of the exemplary horizontal gate all around structure at another stage during fabrication in accordance with some embodiments. FIG. 9B is a cross sectional view of the exemplary horizontal gate all around structure in FIG. 9A along the line 190 in accordance with some embodiments. As shown in FIGS. 8A, 8B, 9A and 9B, a CMP process is performed on the cap layer 802 and stops at the poly layer 202. The cap layer 802 has a thickness of about 20 nanometers. Next, poly layer removal takes place to expose the fin 110.

Referring to FIG. 9A, a semiconductor structure 900 on a substrate 102 is provided. The structure 900 includes a source and drain region 502; an interlayer dielectric layer 702 over the source and drain region 502; and a cap layer 802 over the interlayer dielectric layer 702 for protection. The structure 900 further includes an etch stop layer 704 between the interlayer dielectric layer 702 and the source and drain region 502. The cap layer 802 is made of nitride. The cap layer 802 protects the interlayer dielectric layer 702 from damage by following processes.

FIG. 10A is a longitudinal sectional view of the exemplary horizontal gate all around structure at another stage during fabrication in accordance with some embodiments. FIG. 10B is a cross sectional view of the exemplary horizontal gate all around structure in FIG. 10A along the line 190 in accordance with some embodiments. As shown in FIGS. 10A and 10B, a second STI etch-back is performed on the STI 104 to expose more of the bottom sacrificial layer 118 of the fins 110, 120, 130, 140 and stops at a second level 1080 of the STI 104. The difference 1002 between the first level 180 and the second level 1080 is about 10-50 nanometers so that the exposed fin height 170 increases by about 10-50 nanometers.

FIG. 11A is a longitudinal sectional view of the exemplary horizontal gate all around structure at another stage during fabrication in accordance with some embodiments. FIG. 11B is a cross sectional view of the exemplary horizontal gate all around structure in FIG. 11A along the line 190 in accordance with some embodiments. As shown in FIGS. 11A and 11B, due to additional exposure of the bottom sacrificial layer 118 resulted from the second STI etch-back, the top sacrificial layer 116 and the bottom sacrificial layer 118 are easily etched by using, for example, an isotropic etching, and then are oxidized. In the embodiment, the oxidization process turns the top sacrificial layer 116 and the bottom sacrificial layer 118 made of SiGe into SiGeOx. Moreover, the surfaces of the top channel layer 112 and the bottom channel layer 114 are partially oxidized by such process so that a cleaning process may be applied to the top channel layer 112 and the bottom channel layer 114 to form channels 1102, 1104. Therefore, the cap layer 802 protects the interlayer dielectric layer 702 from damage by, for example, the STI etch-back process and the process for removing the top sacrificial layer 116 and the bottom sacrificial layer 118.

FIG. 12A is a longitudinal sectional view of the exemplary horizontal gate all around structure at another stage during fabrication in accordance with some embodiments. FIG. 12B is a cross sectional view of the exemplary horizontal gate all around structure in FIG. 12A along the line 190 in accordance with some embodiments. As shown in FIGS. 12A and 12B, gate formation follows channel formation. Formation of gates 1202, 1204 is applied around the channels 1102, 1104, and involves forming a gate around the channels, including depositing another interfacial layer dielectric with high-K dielectrics; depositing work function metals; and depositing metal gate material. Therefore, compared to conventional methods limited by the initial fin height 170 between the upper surface of the top channel layer 112 and the first level 180 of the STI 104, the double STI recess method provides greater fin height 1270, a larger process window for HGAA nanowire formation, to achieve high aspect ratio of multi-stack nanowires.

The horizontal structure may be configured as follows: the substrate material may be Si, SiGe, Ge, or III/V Epi (InP, GaAs, AlAs, InAs, InAlAs, InGaAs, InSb, GaSb, InAlSb, InGaSb); the nanowire material may be Si, SiGe, Ge, or III/V Epi (InP, GaAs, AlAs, InAs, InAlAs, InGaAs, InSb, GaSb, InAlSb, InGaSb); the substrate material can be same or different with the nanowire material; the high-K dielectrics may be a single layer or multiple layers structure with HfO2, ZrO2, HfZrO2, Ga2O3, Gd2O3, TaSiO2, Al2O3, or TiO2; the work function metal (WFM) for P-type horizontal structures may be TiN, W, WN, Mo, or MoN; the WFM for N-type horizontal structures may be TiAl, TiAlC, or TaAlC; the metal gate (MG) material may be Al, W, Co, or Cu.

Additionally, the drain may refer to a region that has been treated as a drain, or a region that has not been treated but to be treated as a drain. The source may refer to a region that has been treated as a source, or a region that has not been treated but to be treated as a source. The channel may refer to a region that has been treated as a channel, or a region that has not been treated but to be treated as a channel.

FIG. 13A is a longitudinal sectional view of an exemplary horizontal gate all around structure at one stage during fabrication in accordance with some embodiments. FIG. 13B is a cross sectional view of the exemplary horizontal gate all around structure in FIG. 13A along the line 1390 in accordance with some embodiments. As shown in FIGS. 13A and 13B, the semiconductor device 1300 includes a plurality of fins 1310, 1320, 1330, 1340, a substrate 1302, and a shallow trench isolation (STI) 1304. Firstly, the STI 1304 is filled between the fins 1310, 1320, 1330, 1340. Then, a STI etchback is performed on the STI 1304 to expose the fins 1310, 1320, 1330, 1340 and stops at a first level 1380 of the STI 1304.

Each of the fins 1310, 1320, 1330, 1340 includes a channel layer 1312 and a sacrificial layer 1318 between the substrate 1302 and the channel layer 1314. The material of the channel layer 1312 may be Si, and the material of the sacrificial layer 1316 may be SiGe. It is noted that the number of layers used in the fins 1310, 1320, 1330, 1340 is not limited and may vary based on different designs. In the embodiment, the exposed fin height 1370 between the upper surface of the channel layer 1312 and the first level 1380 of the STI 1304 is less than about 50 nanometers. The thickness 1301 of the STI 1304 is about 50-150 nanometers.

FIG. 14A is a longitudinal sectional view of the exemplary horizontal gate all around structure at another stage during fabrication in accordance with some embodiments. FIG. 14B is a cross sectional view of the exemplary horizontal gate all around structure in FIG. 14A along the line 1390 in accordance with some embodiments. As shown in FIGS. 14A and 14B, after formation of the fins, a poly layer 1402 is formed over a preset portion 1404 of the fin 1310 corresponding to a channel. Moreover, a hard mask 1406 is formed over the poly layer 1402 for protecting its top.

FIG. 15A is a longitudinal sectional view of the exemplary horizontal gate all around structure at another stage during fabrication in accordance with some embodiments. FIG. 15B is a cross sectional view of the exemplary horizontal gate all around structure in FIG. 15A along the line 1390 in accordance with some embodiments. As shown in FIGS. 15A and 15B, after forming the poly layer 1402 and the hard mask 1406, spacers 1502 are formed over sidewalls of the poly layer 1402 and the hard mask 1406 to protect them from damages by the following processes.

FIG. 16A is a longitudinal sectional view of the exemplary horizontal gate all around structure at another stage during fabrication in accordance with some embodiments. FIG. 16B is a cross sectional view of the exemplary horizontal gate all around structure in FIG. 16A along the line 1390 in accordance with some embodiments. As shown in FIGS. 16A and 16B, the fin 1310 except for the portion covered by the hard mask 1406 or by the spacers 1502 is etched to create a recess 1602 for source and drain regions.

Figures 17A, 17B:
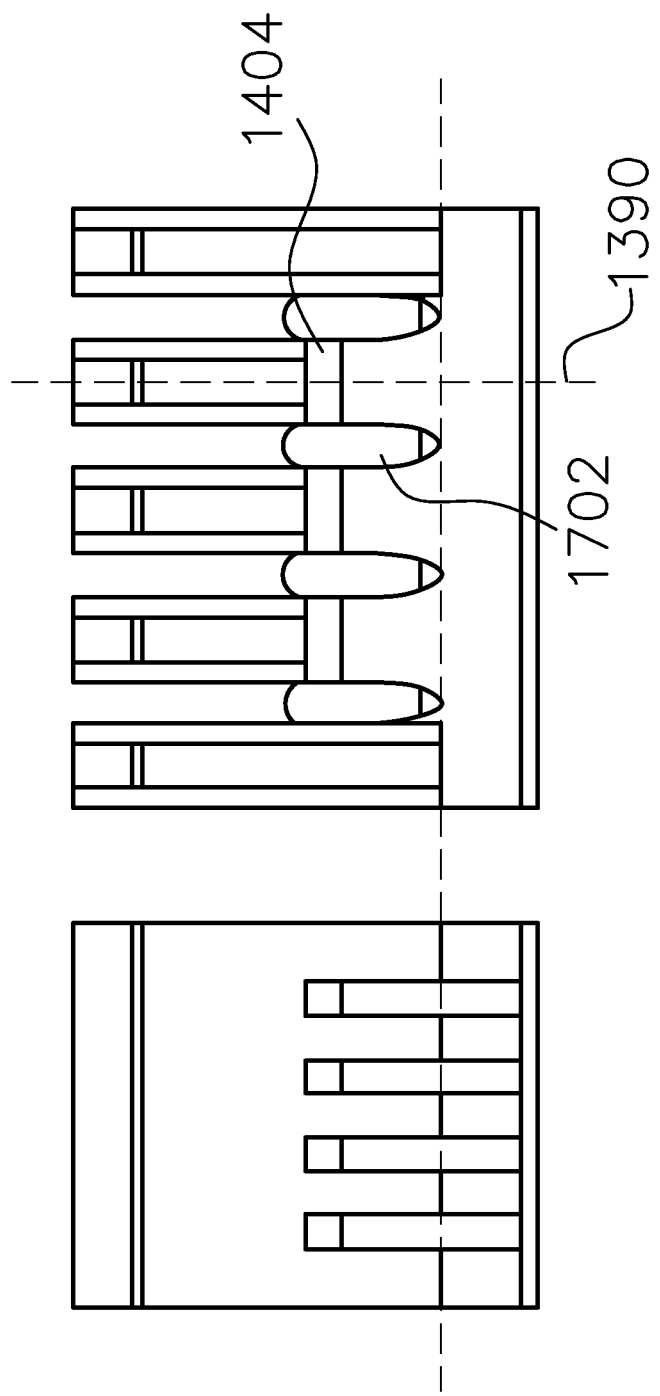
FIG. 17A is a longitudinal sectional view of an exemplary horizontal gate all around structure at one stage during fabrication in accordance with some embodiments.
FIG. 17B is a cross sectional view of the exemplary horizontal gate all around structure in FIG. 17A along the line 1390 in accordance with some embodiments.

FIG. 17A is a longitudinal sectional view of the exemplary horizontal gate all around structure at another stage during fabrication in accordance with some embodiments. FIG. 17B is a cross sectional view of the exemplary horizontal gate all around structure in FIG. 17A along the line 1390 in accordance with some embodiments. As shown in FIGS. 17A and 17B, by using epitaxial growth operations, a source and drain region 1702 is formed adjacent to the preset portion 1404 corresponding to the channel. The source and drain material may include SiP for N-type devices and SiGeB for P-type devices.

FIG. 18A is a longitudinal sectional view of the exemplary horizontal gate all around structure at another stage during fabrication in accordance with some embodiments. FIG. 18B is a cross sectional view of the exemplary horizontal gate all around structure in FIG. 18A along the line 1390 in accordance with some embodiments. As shown in FIGS. 17A, 17B, 18A and 18B, after source and drain region formation, the hard mask 1406 and the portion of the spacers 1502 surrounding the hard mask 1406 are removed.

FIG. 19A is a longitudinal sectional view of the exemplary horizontal gate all around structure at another stage during fabrication in accordance with some embodiments. FIG. 19B is a cross sectional view of the exemplary horizontal gate all around structure in FIG. 19A along the line 1390 in accordance with some embodiments. As shown in FIGS. 19A and 19B, after removal of the hard mask 1406, formation of the interlayer dielectric layer 1902 over the source and drain region 1702 may take place. The formation of the interlayer dielectric layer 1902 may involve depositing interlayer dielectric material and shaping the interlayer dielectric material using CMP processes. Additionally, an etch stop layer 1904 may be deposited before the interlayer dielectric layer formation. Next, the spacers 1502, the etch stop layer 1904, and the interlayer dielectric layer 1902 are etched back to make a recess 1906.

FIG. 20A is a longitudinal sectional view of the exemplary horizontal gate all around structure at another stage during fabrication in accordance with some embodiments. FIG. 20B is a cross sectional view of the exemplary horizontal gate all around structure in FIG. 20A along the line 1390 in accordance with some embodiments. As shown in FIGS. 20A and 20B, a cap layer 2002 is deposited over the poly layer 1402, the spacers 1502, the etch stop layer 1904, and the interlayer dielectric layer 1902. The material of the cap layer 2002 may includes SiN and SiCN. The cap layer 2002 may have a thickness of about 45 nanometers (SiN for about 20 nanometers and SiCN for about 25 nanometers).

FIG. 21A is a longitudinal sectional view of the exemplary horizontal gate all around structure at another stage during fabrication in accordance with some embodiments. FIG. 21B is a cross sectional view of the exemplary horizontal gate all around structure in FIG. 21A along the line 1390 in accordance with some embodiments. As shown in FIGS. 20A, 20B, 21A and 21B, a CMP process is performed on the cap layer 2002 and stops at the poly layer 1402. The cap layer 2002 has a thickness of about 20 nanometers. Next, poly layer removal takes place to expose the fin 1310. The following processes of etching of the sacrificial layer 1316 and oxidation of the sacrificial layer 1316 are similar to those in FIGS. 11A and 11B, and hence are not repeated herein. Therefore, the cap layer 2002 protects the interlayer dielectric layer 1902 from damage by, for example, the poly removal process, the STI etch-back process and the process for removing the sacrificial layer 1316.

Figure 22:
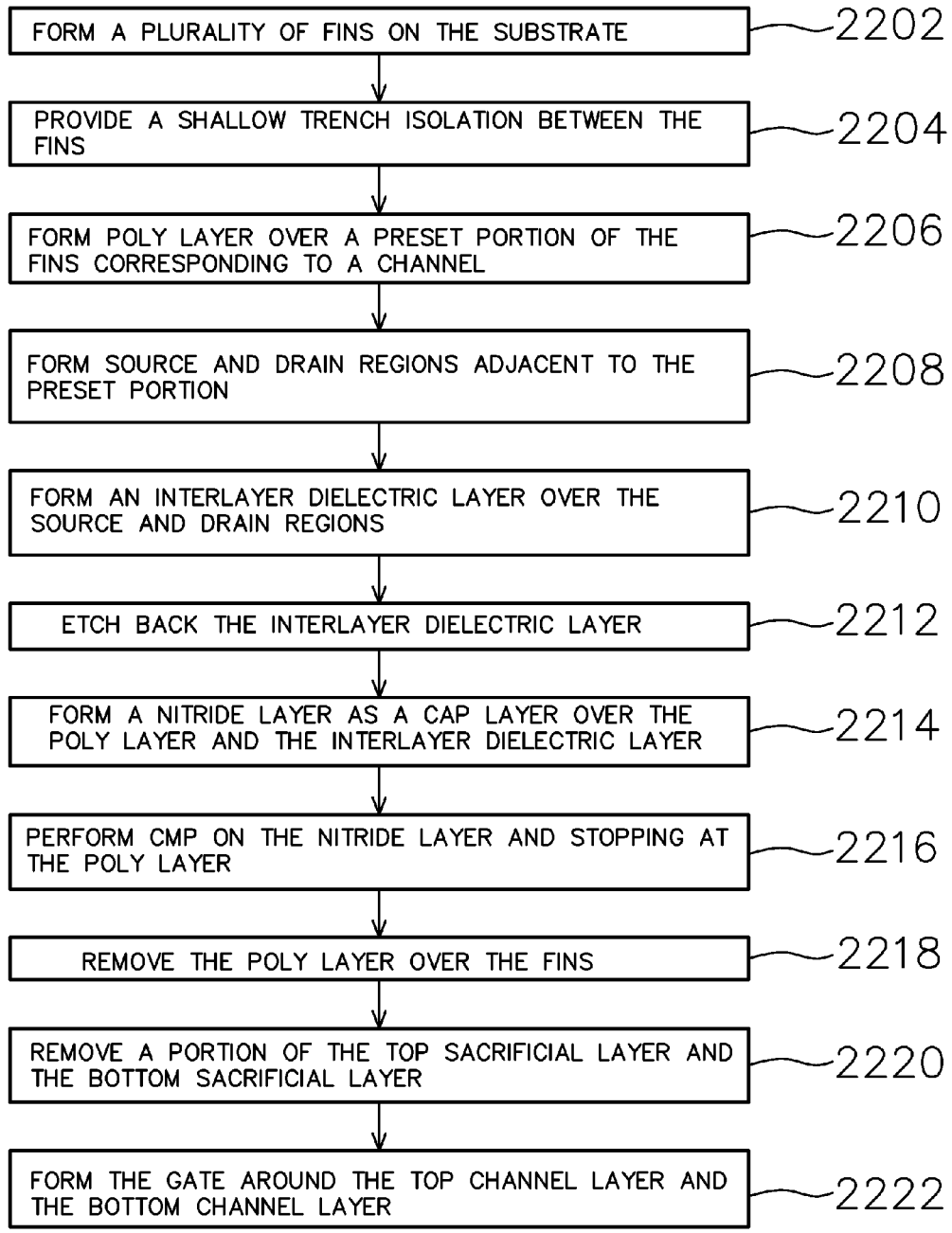
FIG. 22 is a flow chart for a method of forming a semiconductor device having a horizontal gate all around structure on a substrate.

FIG. 22 is a flow chart for a method of forming a semiconductor device having a horizontal gate all around structure on a substrate. As shown in FIG. 22, a method 2200 is provided. The method 2200 includes the following operations: forming a plurality of fins on the substrate (2202), wherein each fin comprises a top channel layer, a bottom channel layer below the top channel layer, a top sacrificial layer between the top channel layer and the bottom channel layer, and a bottom sacrificial layer between the substrate and the bottom channel layer; providing a shallow trench isolation between the fins (2204); forming poly layer over a preset portion of the fins (2206); forming source and drain regions adjacent to the preset portion (2208); forming an interlayer dielectric layer over the source and drain regions (2210); etching back the interlayer dielectric layer (2212); forming a nitride layer as a cap layer over the poly layer and the interlayer dielectric layer (2214); performing CMP on the nitride layer and stopping at the poly layer (2216); removing the poly layer over the fins (2218); removing a portion of the top sacrificial layer and the bottom sacrificial layer (2220); and forming the gate around the top channel layer and the bottom channel layer (2222).

The operation of forming the fins on the substrate further comprises forming the fins with Si as the top channel layer and the bottom channel layer and with SiGe as the top sacrificial layer and the bottom sacrificial layer. The operation of forming the nitride layer over the poly layer and the interlayer dielectric layer further comprises forming the nitride layer by using at least one of SiN and SiCN.

Figure 23:
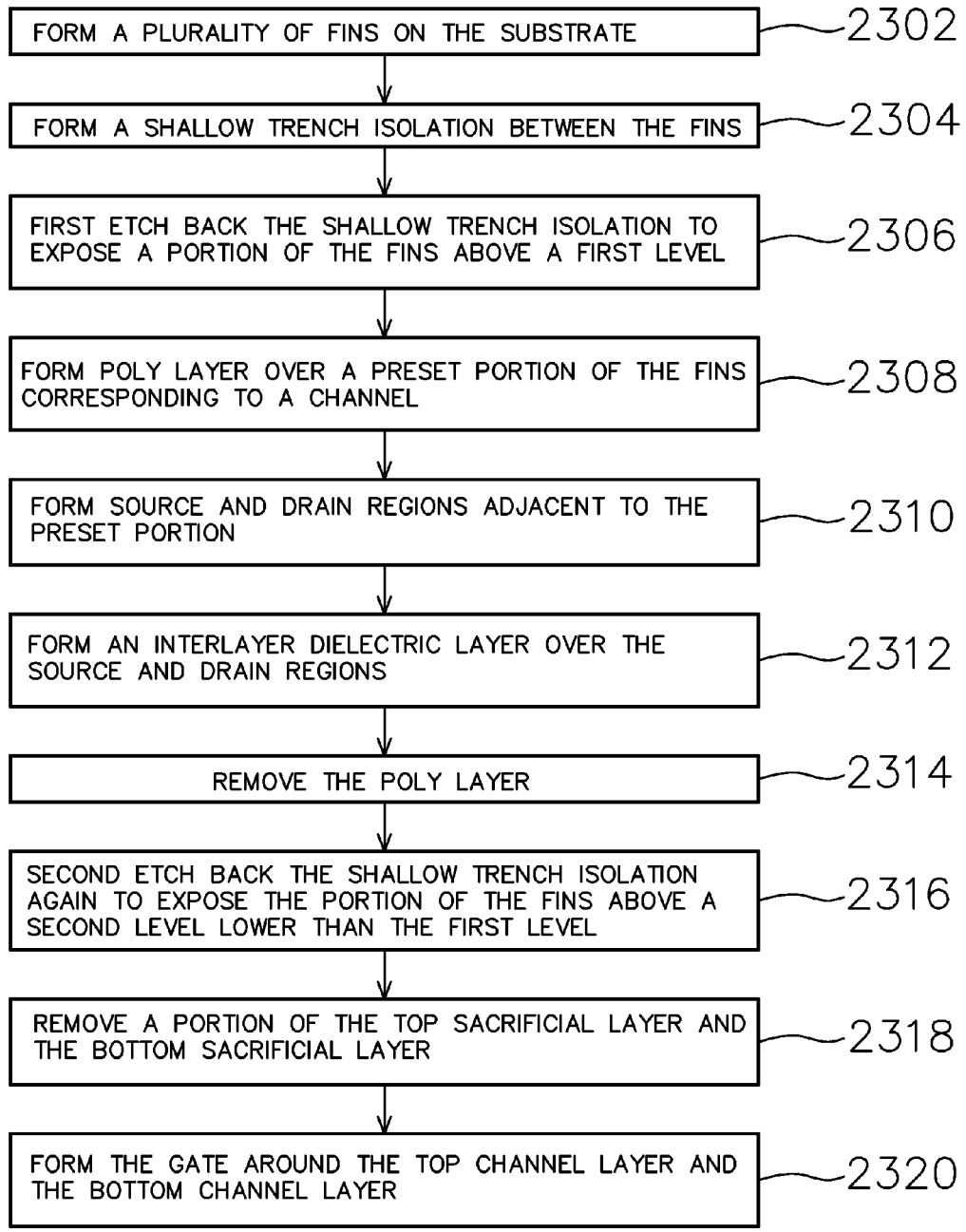
FIG. 23 is a flow chart for a method of forming a semiconductor device having a horizontal gate all around structure on a substrate.

FIG. 23 is a flow chart for a method of forming a semiconductor device having a horizontal gate all around structure on a substrate. As shown in FIG. 23, a method 2300 is provided. The method 2300 includes the following operations: forming a plurality of fins on the substrate (2302), wherein each fin comprises a top channel layer, a bottom channel layer below the top channel layer, a top sacrificial layer between the top channel layer and the bottom channel layer, and a bottom sacrificial layer between the substrate and the bottom channel layer; forming a shallow trench isolation between the fins (2304); etching the shallow trench isolation to expose a portion of the fins above a first level (2306); forming poly layer over a preset portion of the fins (2308); forming source and drain regions adjacent to the preset portion (2310); forming an interlayer dielectric layer over the source and drain regions (2312); removing the poly layer (2314); etching the shallow trench isolation to expose the portion of the fins above a second level lower than the first level (2316); removing a portion of the top sacrificial layer and the bottom sacrificial layer (2318); and forming the gate around the top channel layer and the bottom channel layer (2320).

The operation of etching back the shallow trench isolation again to expose the portion of the fins above the second level lower than the first level further comprises etching back the shallow trench isolation to expose the portion of the fins above the second level lower than the first level for about 10-30 nanometer. The operation of etching back the shallow trench isolation material to expose the portion of the fins comprises etching back the shallow trench isolation material to expose the portion of the fins having a height less than about 50 nanometers.

The method further comprises: forming hard masks to protect a top of the poly layer; and forming spacers to protect a sidewall of the poly layer. The method further comprises forming a cap layer over the interlayer dielectric layer. The operation of forming the cap layer over the interlayer dielectric layer further comprises: etching back the interlayer dielectric layer; forming a nitride layer over the poly layer and the interlayer dielectric layer; performing CMP on the nitride layer and stopping at the poly layer; and removing the poly layer. The operation of forming the nitride layer over the poly layer and the interlayer dielectric layer further comprises forming the nitride layer by using at least one of SiN and SiCN.

Figure 24:
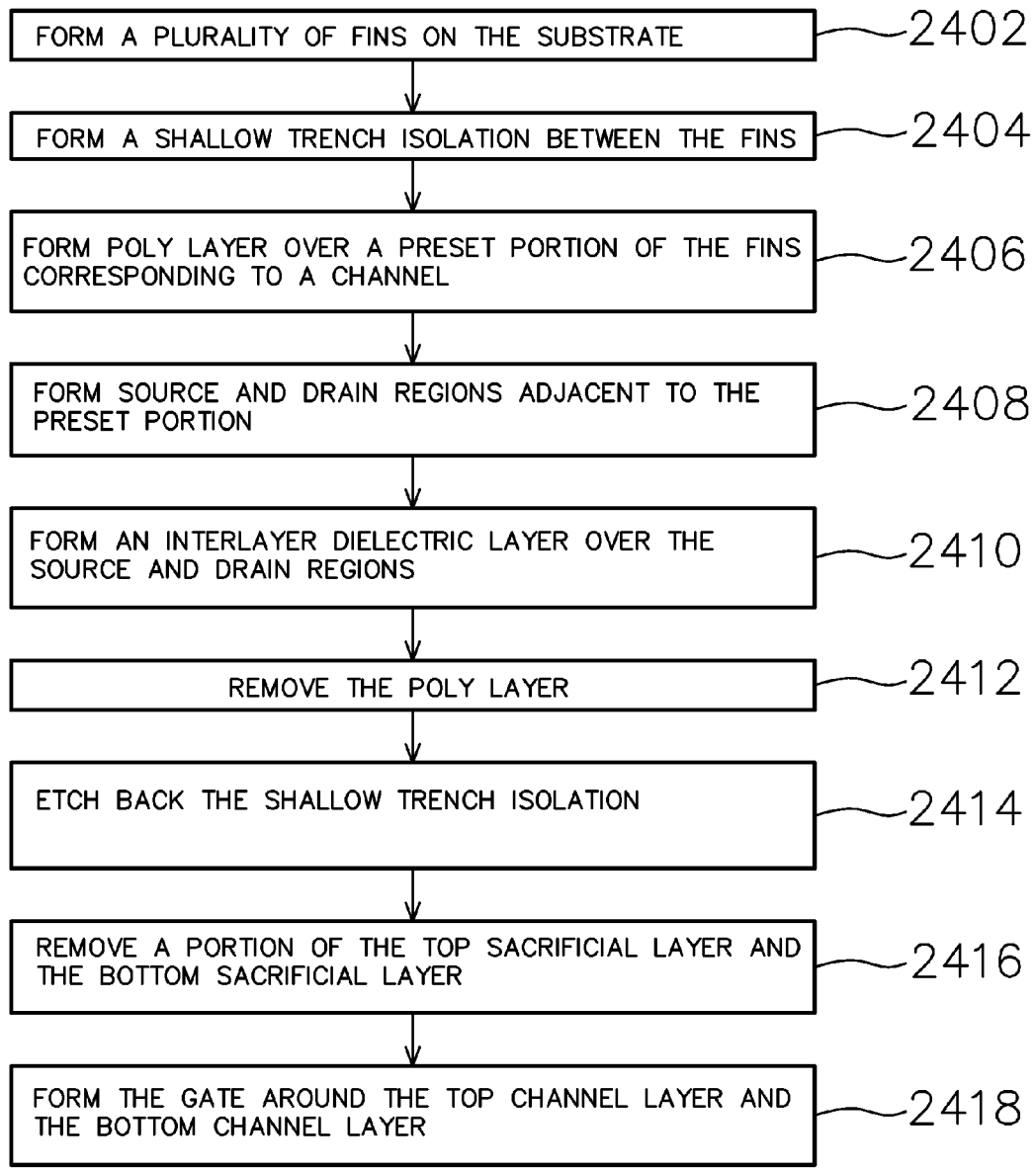
FIG. 24 is a flow chart for a method of forming a semiconductor device having a horizontal gate all around structure on a substrate.

FIG. 24 is a flow chart for a method of forming a semiconductor device having a horizontal gate all around structure on a substrate. As shown in FIG. 24, a method 2400 is provided. The method 2400 includes the following operations: forming a plurality of fins on the substrate (2402), wherein each fin comprises a top channel layer, a bottom channel layer below the top channel layer, a top sacrificial layer between the top channel layer and the bottom channel layer, and a bottom sacrificial layer between the substrate and the bottom channel layer; providing a shallow trench isolation between the fins (2404); forming poly layer over a preset portion of the fins (2406); forming source and drain regions adjacent to the preset portion (2408); forming an interlayer dielectric layer over the source and drain regions (2410); removing the poly layer (2412); etching back the shallow trench isolation (2414); removing a portion of the top sacrificial layer and the bottom sacrificial layer (2416); and forming the gate around the top channel layer and the bottom channel layer (2418).

The method further comprises forming a cap layer over the interlayer dielectric layer. The operation of etching back the shallow trench isolation again to expose the portion of the fins above the second level lower than the first level further comprises etching back the shallow trench isolation to expose the portion of the fins above the second level lower than the first level for about 10-30 nanometer. The operation of providing the shallow trench isolation between the fins further comprises: forming shallow trench isolation material between the fins; and etching back the shallow trench isolation material to expose a portion of the fins. The operation of etching back the shallow trench isolation material to expose the portion of the fins comprises etching back the shallow trench isolation material to expose the portion of the fins having a height less than about 50 nanometers.

The operation of forming the cap layer over the interlayer dielectric layer further comprises: etching back the interlayer dielectric layer; forming a nitride layer over the poly layer and the interlayer dielectric layer; performing CMP on the nitride layer and stopping at the poly layer; and removing the poly layer. The operation of forming the nitride layer over the poly layer and the interlayer dielectric layer further comprises: forming the nitride layer by using at least one of SiN and SiCN. The operation of forming the source and drain regions comprises creating recesses in the fins for the source and drain regions.

The method further comprises: forming hard masks to protect a top of the poly layer; and forming spacers to protect a sidewall of the poly layer. The operation of wherein forming the fins on the substrate further comprises forming the fins with Si as the top channel layer and the bottom channel layer and with SiGe as the top sacrificial layer and the bottom sacrificial layer. The method further comprises oxidizing the top sacrificial layer and the bottom sacrificial layer.

Figure 25:
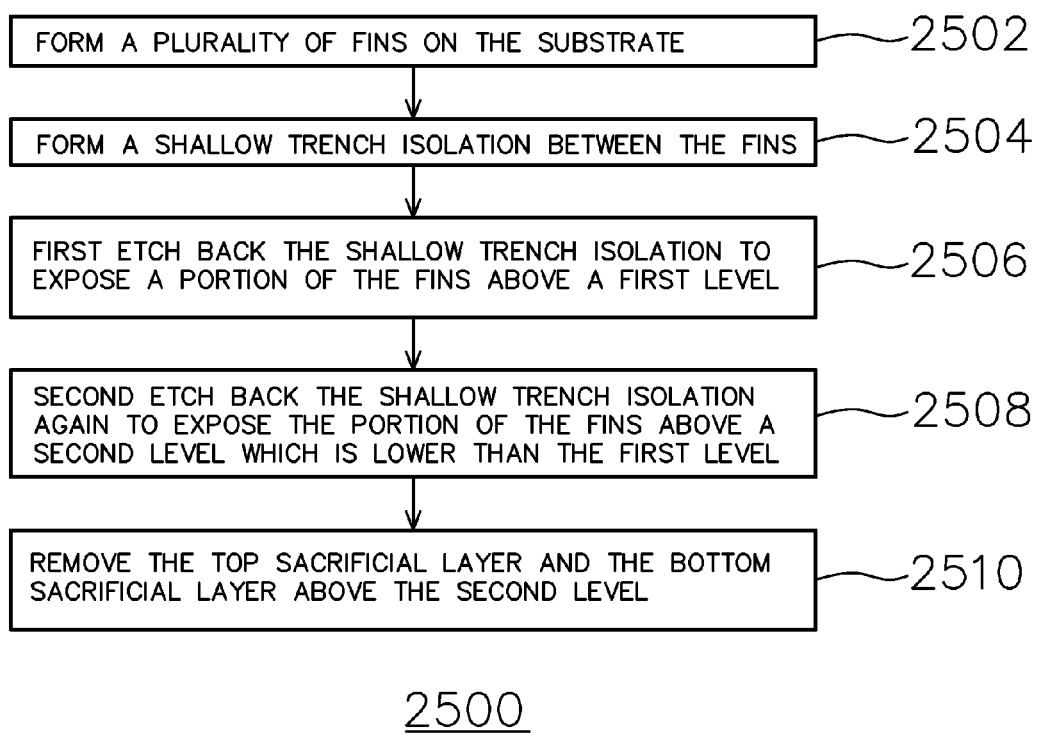
FIG. 25 is a flow chart for a method of forming a semiconductor device having a horizontal gate all around structure on a substrate.

FIG. 25 is a flow chart for a method of forming a semiconductor device having a horizontal gate all around structure on a substrate. As shown in FIG. 25, a method 2500 is provided. The method 2500 includes the following operations: forming a plurality of fins on the substrate (2502); forming a shallow trench isolation between the fins (2504); first etching back the shallow trench isolation to expose a portion of the fins above a first level (2506); second etching back the shallow trench isolation again to expose the portion of the fins above a second level which is lower than the first level (2508); and removing the top sacrificial layer and the bottom sacrificial layer above the second level (2510).

The operation of etching back the shallow trench isolation again to expose the portion of the fins above the second level lower than the first level further comprises etching back the shallow trench isolation to expose the portion of the fins above the second level lower than the first level for about 10-30 nanometer. The operation of etching back the shallow trench isolation material to expose the portion of the fins comprises etching back the shallow trench isolation material to expose the portion of the fins having a height less than about 50 nanometers. The method further comprises oxidizing the top sacrificial layer and the bottom sacrificial layer. The operation of first etching back the shallow trench isolation further comprises etching back the shallow trench isolation to expose the top sacrificial layer of the fin. The operation of second etching back the shallow trench isolation further comprises etching back the shallow trench isolation to expose the bottom sacrificial layer of the fin.

Figure 26:
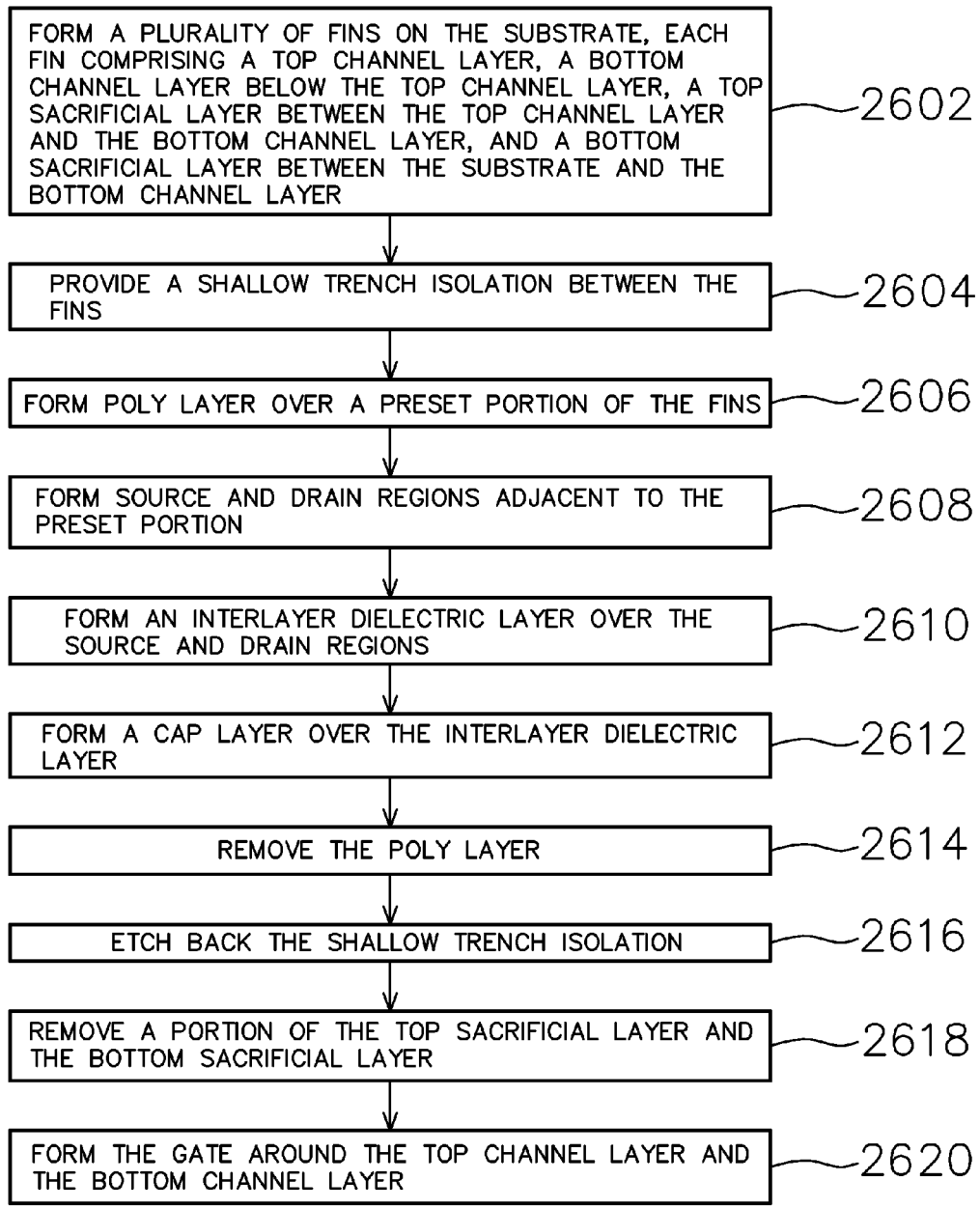
FIG. 26 is a flow chart for a method of forming a semiconductor device having a horizontal gate all around structure on a substrate.

FIG. 26 is a flow chart for a method of forming a semiconductor device having a horizontal gate all around structure on a substrate. As shown in FIG. 26, a method 2600 is provided. The method 2600 includes: forming a plurality of fins on the substrate (2602); providing a shallow trench isolation between the fins (2604); forming poly layer over a preset portion of the fins (2606); forming source and drain regions adjacent to the preset portion (2608); forming an interlayer dielectric layer over the source and drain regions (2610); forming a cap layer over the interlayer dielectric layer (2612); removing the poly layer (2614); etching back the shallow trench isolation (2616); removing a portion of the top sacrificial layer and the bottom sacrificial layer (2618); and forming the gate around the top channel layer and the bottom channel layer (2620).

The operation of forming the cap layer over the interlayer dielectric layer further comprises: etching back the interlayer dielectric layer; forming a nitride layer over the poly layer and the interlayer dielectric layer; performing CMP on the nitride layer and stopping at the poly layer; and removing the poly layer. The operation of forming the nitride layer over the poly layer and the interlayer dielectric layer further comprises: forming the nitride layer by using at least one of SiN and SiCN.

As mentioned above, this disclosure provides a horizontal structure having a cap layer. The method of forming horizontal structures having a cap layer includes: providing an interlayer dielectric layer and a poly layer adjacent to and having a top surface higher than the interlayer dielectric layer; forming a nitride layer as a cap layer over the poly layer and the interlayer dielectric layer; and performing CMP on the nitride layer and stopping at the poly layer. The cap layer protects the interlayer dielectric layer from damage by following processes.

As mentioned above, This disclosure provides a horizontal structure by using a double STI recess method. The double STI recess method includes: forming a plurality of fins on the substrate; forming shallow trench isolation between the fins; performing first etch-back on the shallow trench isolation; forming source and drain regions adjacent to channels of the fins; and performing second etch-back on the shallow trench isolations to expose a lower portion of the fins as a larger process window for forming gates of the fins. Accordingly, compared to conventional methods limited by fin height from the STI, the double STI recess method provides greater fin height to produce multi-stack HGAA nanowires with high current density.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device having a horizontal gate all around structure on a substrate, the method comprising:
   forming a plurality of fins on the substrate, each fin comprising a top channel layer, a bottom channel layer below the top channel layer, a top sacrificial layer between the top channel layer and the bottom channel layer, and a bottom sacrificial layer between the substrate and the bottom channel layer;
   forming a shallow trench isolation between the fins;
   etching the shallow trench isolation to expose a portion of the fins above a first level;
   etching the shallow trench isolation to expose the portion of the fins above a second level which is lower than the first level; and
   removing the top sacrificial layer and the bottom sacrificial layer above the second level.

2. The method of claim 1, wherein etching back the shallow trench isolation again to expose the portion of the fins above the second level lower than the first level further comprises etching back the shallow trench isolation to expose the portion of the fins above the second level lower than the first level for about 10-50 nanometers.

3. The method of claim 1, wherein etching back the shallow trench isolation material to expose the portion of the fins comprises etching back the shallow trench isolation material to expose the portion of the fins having a height less than about 50 nanometers.

4. The method of claim 1, further comprising oxidizing the top sacrificial layer and the bottom sacrificial layer.

5. The method of claim 1, wherein first etching back the shallow trench isolation further comprises etching back the shallow trench isolation to expose the top sacrificial layer of the fin.

6. The method of claim 1, wherein second etching back the shallow trench isolation further comprises etching back the shallow trench isolation to expose the bottom sacrificial layer of the fin.

7. A method of forming a semiconductor device having a horizontal gate all around structure on a substrate, the method comprising:
   forming a plurality of fins on the substrate, each fin comprising a top channel layer, a bottom channel layer below the top channel layer, a top sacrificial layer between the top channel layer and the bottom channel layer, and a bottom sacrificial layer between the substrate and the bottom channel layer;
   providing a shallow trench isolation between the fins;
   forming poly layer over a preset portion of the fins;
   forming source and drain regions adjacent to the preset portion;

forming an interlayer dielectric layer over the source and drain regions;
forming a cap layer over the interlayer dielectric layer;
removing the poly layer;
etching back the shallow trench isolation;
removing a portion of the top sacrificial layer and the bottom sacrificial layer; and
forming the gate around the top channel layer and the bottom channel layer.

8. The method of claim 7, wherein forming the cap layer over the interlayer dielectric layer further comprises:
etching back the interlayer dielectric layer;
forming a nitride layer over the poly layer and the interlayer dielectric layer;
performing CMP on the nitride layer and stopping at the poly layer; and
removing the poly layer.

9. The method of claim 8, wherein forming the nitride layer over the poly layer and the interlayer dielectric layer further comprises: forming the nitride layer by using at least one of SiN and SiCN.

10. A method of forming a semiconductor device having a horizontal gate all around structure on a substrate, the method comprising:
forming a plurality of fins on the substrate, each fin comprising a top channel layer, a bottom channel layer below the top channel layer, a top sacrificial layer between the top channel layer and the bottom channel layer, and a bottom sacrificial layer between the substrate and the bottom channel layer;
providing a shallow trench isolation between the fins;
forming poly layer over a preset portion of the fins;
forming source and drain regions adjacent to the preset portion;
forming an interlayer dielectric layer over the source and drain regions;
removing the poly layer;
etching back the shallow trench isolation;
removing a portion of the top sacrificial layer and the bottom sacrificial layer; and
forming the gate around the top channel layer and the bottom channel layer.

11. The method of claim 10, wherein etching back the shallow trench isolation again to expose the portion of the fins above the second level lower than the first level further comprises etching back the shallow trench isolation to expose the portion of the fins above the second level lower than the first level for about 10-50 nanometers.

12. The method of claim 10, wherein providing the shallow trench isolation between the fins further comprises:
forming shallow trench isolation material between the fins; and
etching back the shallow trench isolation material to expose a portion of the fins.

13. The method of claim 10, wherein etching back the shallow trench isolation material to expose the portion of the fins comprises etching back the shallow trench isolation material to expose the portion of the fins having a height less than about 50 nanometers.

14. The method of claim 10, further comprising forming a cap layer over the interlayer dielectric layer.

15. The method of claim 10, wherein forming the cap layer over the interlayer dielectric layer further comprises:
etching back the interlayer dielectric layer;
forming a nitride layer over the poly layer and the interlayer dielectric layer;
performing CMP on the nitride layer and stopping at the poly layer; and
removing the poly layer.

16. The method of claim 15, wherein forming the nitride layer over the poly layer and the interlayer dielectric layer further comprises: forming the nitride layer by using at least one of SiN and SiCN.

17. The method of claim 10, wherein forming the source and drain regions comprises creating recesses in the fins for the source and drain regions.

18. The method of claim 10, further comprising: forming hard masks to protect a top of the poly layer; and forming spacers to protect a sidewall of the poly layer.

19. The method of claim 10, wherein forming the fins on the substrate further comprises forming the fins with Si as the top channel layer and the bottom channel layer and with SiGe as the top sacrificial layer and the bottom sacrificial layer.

20. The method of claim 10, further comprising oxidizing the top sacrificial layer and the bottom sacrificial layer.

* * * * *